(12) United States Patent
Hong et al.

(10) Patent No.: US 11,683,968 B2
(45) Date of Patent: Jun. 20, 2023

(54) ORGANIC LIGHT EMITTING DIODE DISPLAY

(71) Applicant: Samsung Display Co., Ltd., Yongin-si (KR)

(72) Inventors: Jong Ho Hong, Yongin-si (KR); Won Il Choi, Ansan-si (KR); Hye Jin Joo, Suwon-si (KR); Won Sang Park, Yongin-si (KR); Mu Gyeom Kim, Hwaseong-si (KR); Man Sik Myeong, Seoul (KR); Hyo Yul Yoon, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/484,288

(22) Filed: Sep. 24, 2021

(65) Prior Publication Data
US 2022/0013599 A1    Jan. 13, 2022

Related U.S. Application Data

(63) Continuation of application No. 16/864,587, filed on May 1, 2020, now Pat. No. 11,152,434, which is a (Continued)

(30) Foreign Application Priority Data

Mar. 10, 2015 (KR) ........................ 10-2015-0033419

(51) Int. Cl.
| | |
|---|---|
| *H10K 59/35* | (2023.01) |
| *H10K 77/10* | (2023.01) |
| *H01L 29/08* | (2006.01) |
| *H01L 27/32* | (2006.01) |
| *H01L 51/00* | (2006.01) |

(52) U.S. Cl.
CPC ........ *H01L 27/3218* (2013.01); *H01L 27/326* (2013.01); *H01L 27/3223* (2013.01); (Continued)

(58) Field of Classification Search
CPC ............. H01L 27/3278; H01L 27/3276; H01L 27/3223; H01L 27/326; H01L 51/0097; H01L 29/08; H01L 51/5338
(Continued)

(56) References Cited

U.S. PATENT DOCUMENTS

| | | |
|---|---|---|
| 8,063,400 B2 | 11/2011 | Sugimoto |
| 8,084,117 B2 | 12/2011 | Lalvani |

(Continued)

FOREIGN PATENT DOCUMENTS

| | | |
|---|---|---|
| JP | 2008-542834 | 11/2008 |
| JP | 2011-187446 | 9/2011 |

(Continued)

*Primary Examiner* — Thinh T Nguyen
(74) *Attorney, Agent, or Firm* — Kile Park Reed & Houtteman PLLC

(57) ABSTRACT

A diode display includes a substrate having a first island and a second island spaced apart from each other, a first pixel disposed on the first island, and a second pixel disposed on the second island. The first pixel includes a first base layer, a first transistor on the first base layer, a first light emitting element electrically connected to the first transistor, and a first encapsulation layer covering the first light emitting element. The second pixel includes a second base layer, a second transistor on the second base layer, a second light emitting element connected to the second transistor, and a second encapsulation layer covering the second light emitting element.

10 Claims, 25 Drawing Sheets

Related U.S. Application Data continuation of application No. 16/105,361, filed on Aug. 20, 2018, now Pat. No. 10,644,079, which is a continuation of application No. 15/786,819, filed on Oct. 18, 2017, now Pat. No. 10,056,435, which is a continuation of application No. 15/064,917, filed on Mar. 9, 2016, now Pat. No. 9,799,708.

(52) U.S. Cl.
CPC ...... *H01L 27/3276* (2013.01); *H01L 51/0097* (2013.01); *H01L 29/08* (2013.01); *H01L 2251/5338* (2013.01); *Y02E 10/549* (2013.01)

(58) Field of Classification Search
USPC ............. 257/40, 72, 88, 99; 438/22.82, 89
See application file for complete search history.

(56) References Cited

U.S. PATENT DOCUMENTS

| | | | |
|---|---|---|---|
| 8,207,473 B2 | 6/2012 | Axisa et al. | |
| 8,211,725 B2 | 7/2012 | Park et al. | |
| 8,217,381 B2 | 7/2012 | Rogers et al. | |
| 8,389,862 B2 | 3/2013 | Arora et al. | |
| 8,536,667 B2 | 9/2013 | de Graff et al. | |
| 8,552,299 B2 | 10/2013 | Rogers et al. | |
| 8,905,772 B2 | 12/2014 | Rogers et al. | |
| 9,391,286 B1 | 7/2016 | Kwon et al. | |
| 10,064,269 B2 | 8/2018 | Rogers et al. | |
| 10,292,261 B2 | 5/2019 | Rogers et al. | |
| 2007/0122590 A1 | 5/2007 | Lalvani | |
| 2008/0218369 A1 | 9/2008 | Krans et al. | |
| 2010/0002402 A1* | 1/2010 | Rogers et al. | H05K 1/111 361/749 |
| 2010/0330338 A1 | 12/2010 | Boyce et al. | |
| 2012/0052268 A1 | 3/2012 | Axisa et al. | |
| 2014/0138637 A1 | 5/2014 | Yang et al. | |
| 2014/0299362 A1 | 10/2014 | Park et al. | |

FOREIGN PATENT DOCUMENTS

| | | |
|---|---|---|
| KR | 10-2010-0123755 | 11/2010 |
| WO | 2006/129232 | 12/2006 |
| WO | 2008/123416 | 10/2008 |
| WO | 2011/008459 | 1/2011 |

* cited by examiner

Second direction
First direction

ORGANIC LIGHT EMITTING DIODE DISPLAY

CROSS-REFERENCE TO RELATED APPLICATIONS

This is a continuation application of U.S. patent application Ser. No. 16/864,587, filed May 1, 2020 (now pending), the disclosure of which is incorporated herein by reference in its entirety. U.S. patent application Ser. No. 16/864,587 is a continuation application of U.S. patent application Ser. No. 16/105,361, filed Aug. 20, 2018, now U.S. Pat. No. 10,644,079, issued May 5, 2020, the disclosure of which is herein by reference in its entirety. U.S. patent application Ser. No. 16/105,361 is a continuation application of U.S. patent application Ser. No. 15/786,819, filed Oct. 18, 2017, now U.S. Pat. No. 10,056,435, issued Aug. 21, 2018, the disclosure of which is incorporated herein by reference in its entirety. U.S. patent application Ser. No. 15/786,819 is a continuation application of U.S. patent application Ser. No. 15/064,917, filed Mar. 9, 2016, now U.S. Pat. No. 9,799,708, issued Oct. 24, 2017, the disclosure of which is incorporated herein by reference in its entirety. U.S. patent application Ser. No. 15/064,917 claims priority benefit of Korean Patent Application No. 10-2015-0033419 under 35 U.S.C. § 119, filed on Mar. 10, 2015, the disclosure of which is incorporated herein by reference in its entirety for all purposes.

BACKGROUND

1. Field

One or more embodiments described herein relate to an organic light emitting diode display.

2. Description of the Related Art

A variety of flat panel displays have been developed. Examples include a liquid crystal display, a plasma display panel, an organic light emitting diode (OLED) display, a field effect display, and an electrophoretic display. Each pixel of an OLED display has an organic emission layer between two electrodes. Electrons injected from one electrode and holes injected from another electrode combine in the organic emission layer to generate excitons. Light is emitted when excitons change state.

An OLED display has self-luminance characteristics which allow it to achieve improved performance and efficiency, e.g., low power consumption, high luminance, and high response speed. Also, because an OLED display does not require an additional light source (e.g., a backlight), it is also able to be thinner and lighter than other displays.

Recently, a bendable, foldable, stretchable, or extensible display device has been developed. In a stretchable display device, light-emitting devices may be formed on a stretchable substrate. When the stretchable substrate is stretched, the light-emitting devices or wires laminated on an upper portion of the stretchable substrate may be damaged.

SUMMARY

In accordance with one or more embodiments, an organic light emitting diode display includes a stretchable substrate; a plurality of pixel forming plates on the substrate and spaced apart from each other; and first and second pixels on respective first and second pixel forming plates of the plurality of the pixel forming plates adjacent in a first direction, the first and second pixel forming plates connected by a first bridge, and a cut-out groove in the first and second pixel forming plates and adjacent to an area connected to the first bridge.

The first bridge may be curved in a second direction crossing the first direction. The first bridge may have a predetermined width. The first bridge may have a predetermined radius of curvature. The first bridge may be upwardly curved along the second direction.

The first pixel forming plate may include a first main supporting plate; a first wing plate on one lateral surface of the first main supporting plate, wherein one side end portion of the first wing plate is connected to the first bridge; a second wing plate on another lateral surface of the first main supporting plate and adjacent to the one side end portion of the first wing plate; and a first cut-out groove between one side end portion of the second wing plate and the first bridge.

The second pixel forming plate may include a second main supporting plate; a third wing plate on one lateral surface of the second main supporting plate to face the first wing plate of the first pixel forming plate, one side end portion of the third wing plate connected to the first bridge; a fourth wing plate on another lateral surface of the second main supporting plate and adjacent to the one side end portion of the third wing plate; and a second cut-out groove between one side end portion of the fourth wing plate and the first bridge.

The base layer may include a third pixel forming plate adjacent to the first pixel forming plate in the second direction; a third pixel on the third pixel forming plate; and a second bridge connecting the first and third pixel forming plates.

The third pixel forming plate may include a third main supporting plate; a fifth wing plate on one lateral surface of the third main supporting plate to face the second wing plate of the first pixel forming plate, one side end portion of the fifth wing plate connected to the second bridge; and a sixth wing plate on another lateral surface of the third main supporting plate to be adjacent to the one side end portion of the fifth wing plate, wherein the second bridge is connected to the another end portion of the second wing plate of the first pixel forming plate, and a third cut-out groove between one side end portion of the sixth wing plate and the second bridge.

The display may include a plurality of first to third wires on the first pixel forming plate connected to the first pixel, and the first wires may be connected to a second pixel of the second pixel forming plate through an upper side of the first bridge. The first wires may extend in a length direction of the first bridge and may be disposed in an outer side of a center line of the first bridge passing through a center of the first bridge.

The display may include a plurality of dummy wires on the first bridge and disposed above and below the first wires to overlap a portion of the first wires, wherein strain on the dummy wires is greater than that on the first wires. The dummy wires may extend in a length direction of the first bridge and may be disposed in an inner side of a center line of the first bridge passing through a center of the first bridge. The lengths of the dummy wires may decrease from the inner side of the first bridge toward an outer side thereof.

The display may include a sensing thin film transistor on the respective pixel forming plates and connected to at least one of the first to third wires to measure strain on the at least one of the first to third wires. The first wires may include a plurality of gate lines. The second bridge may be curved in the first direction. The second bridge may have a predetermined width. The second bridge may have a predetermined radius of curvature.

The second and third wires may be connected to a third pixel on the third pixel forming plate through an upper side of the second bridge. Based on a center line of the second bridge extending in a length direction of the second bridge and passing through a center of the second bridge, a portion of the second and third wires that have strain in a first range may be disposed in an outer side of the center line, and another portion of the second and third wires that have strain in a second range may be disposed in an inner side of the center line, the second range greater than the first range. The second wires may include a plurality of data lines and the third wires include a plurality of driving voltage lines. The first bridge may be downwardly curved along the second direction.

The first pixel forming plate may include a first main supporting plate; a first wing plate on one lateral surface of the first main supporting plate; and a second wing plate on another lateral surface of the first main supporting plate, wherein one side end portion of the second wing plate is connected to the first bridge, and wherein a first cut-out groove is between one side end portion of the first wing plate adjacent to the one side end portion of the second wing plate and the first bridge.

The second pixel forming plate may include a second main supporting plate; a third wing plate formed on one lateral surface of the second main supporting plate to face the first wing plate of the first pixel forming plate; and a fourth wing plate formed on another lateral surface of the second main supporting plate, wherein one side end portion of the fourth wing plate is connected to the first bridge, and wherein a second cut-out groove is between one side end portion of the third wing plate adjacent to the one side end portion of the fourth wing plate and the first bridge.

The display may include a plurality of the first pixels, and a plurality of the second pixels. Each of the first pixels and the second pixels may include at least one pixel circuit. Each of the first pixels and the second pixels may include a plurality of subpixels. Each of the pixel forming plates may have substantially a polygonal shape.

In accordance with one or more other embodiments, an organic light emitting diode display includes a stretchable substrate; a plurality of pixel forming plates on the substrate and spaced apart from each other; and first and second pixels on respective first and second pixel forming plates of the plurality of the pixel forming plates adjacent in a first direction; and first to third wires on the first pixel forming plate connected to the first pixels, wherein the first and second pixel forming plates are connected by the first bridge, and wherein the first wires are connected to the second pixels of the second pixel forming plate through an upper side of the first bridge.

The first bridge may have a predetermined width and may be curved in a second direction crossing the first direction. The first bridge may have a predetermined radius of curvature. The first wires may extend in a length direction of the first bridge and may be disposed in an outer side of a center line of the first bridge passing through a center of the first bridge.

The display may include a plurality of dummy wires on the first bridge and above and below the first wires overlapping a portion of the first wires, wherein the dummy wires extend in a length direction of the first bridge and are disposed in an inner side of a center line of the first bridge passing through a center of the first bridge, and wherein strain on the dummy wires is greater than strain on the first wires.

The base layer may includes a third pixel forming plate adjacent to the first pixel forming plate in the second direction crossing the first direction, and a second bridge connecting the first and third pixel forming plates, wherein the second and third wires are connected to third pixels on the third pixel forming plate through an upper side of the second bridge. The second bridge may have a predetermined width and is curved in the first direction. The second bridge may have a predetermined radius of curvature.

Based on a center line of the second bridge extending in a length direction of the second bridge and passing through a center of the second bridge, a portion of the second and third wires may have strain in a first range and may be disposed in an outer side of the center line, and another portion of the second and third wires may have strain in a second range and may be disposed in an inner side of the center line, the second range greater than the first range.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
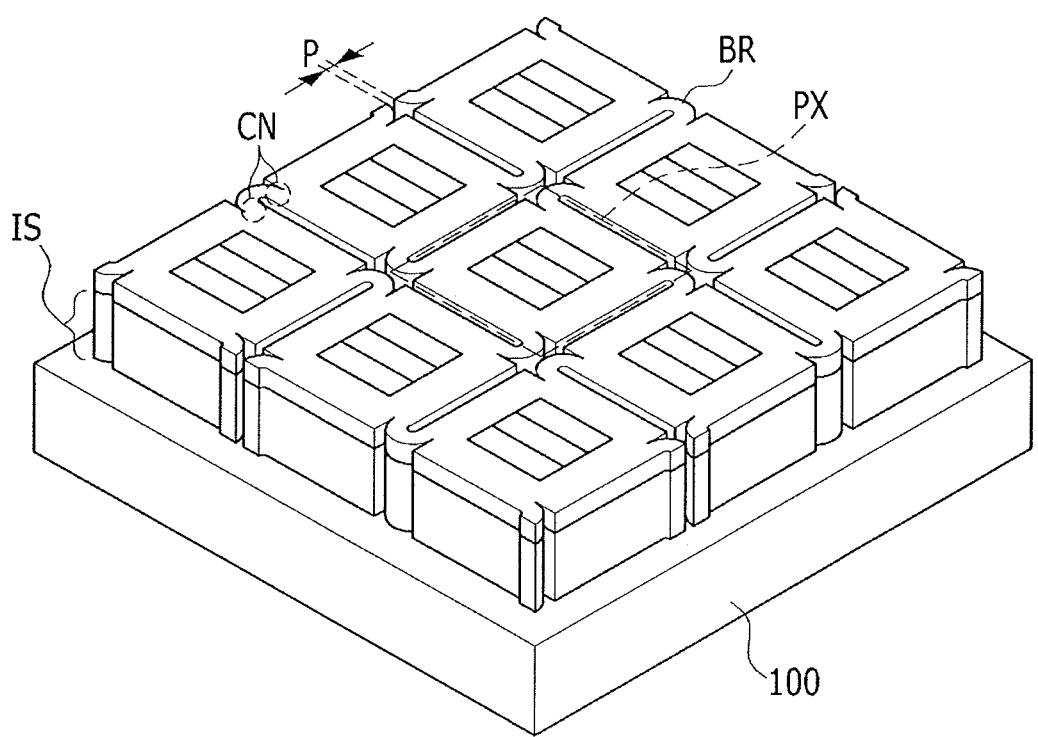
FIG. 1 illustrates an embodiment of an OLED display.

Example embodiments are described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. The embodiments may be combined to form additional embodiments.

It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 2:
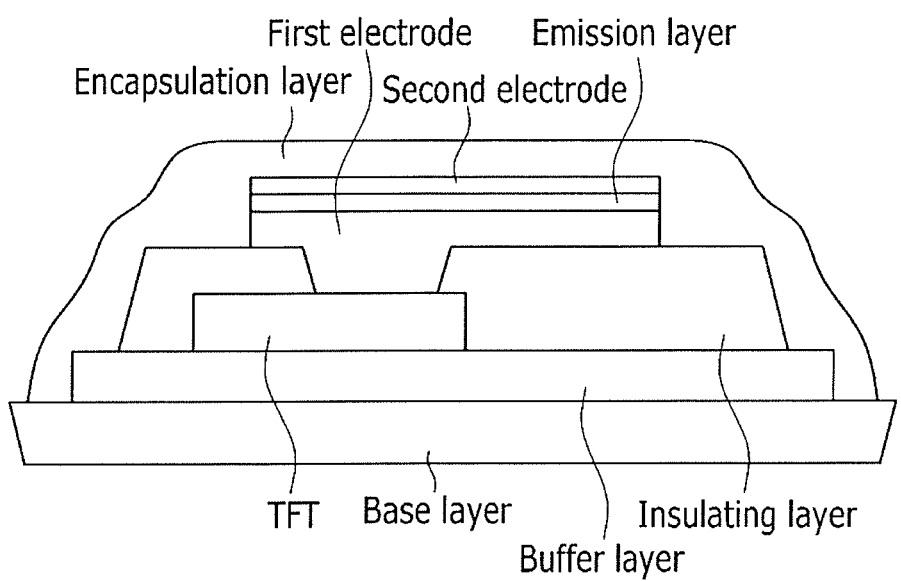
FIG. 2 illustrates an embodiment of a pixel.
Figure 3:
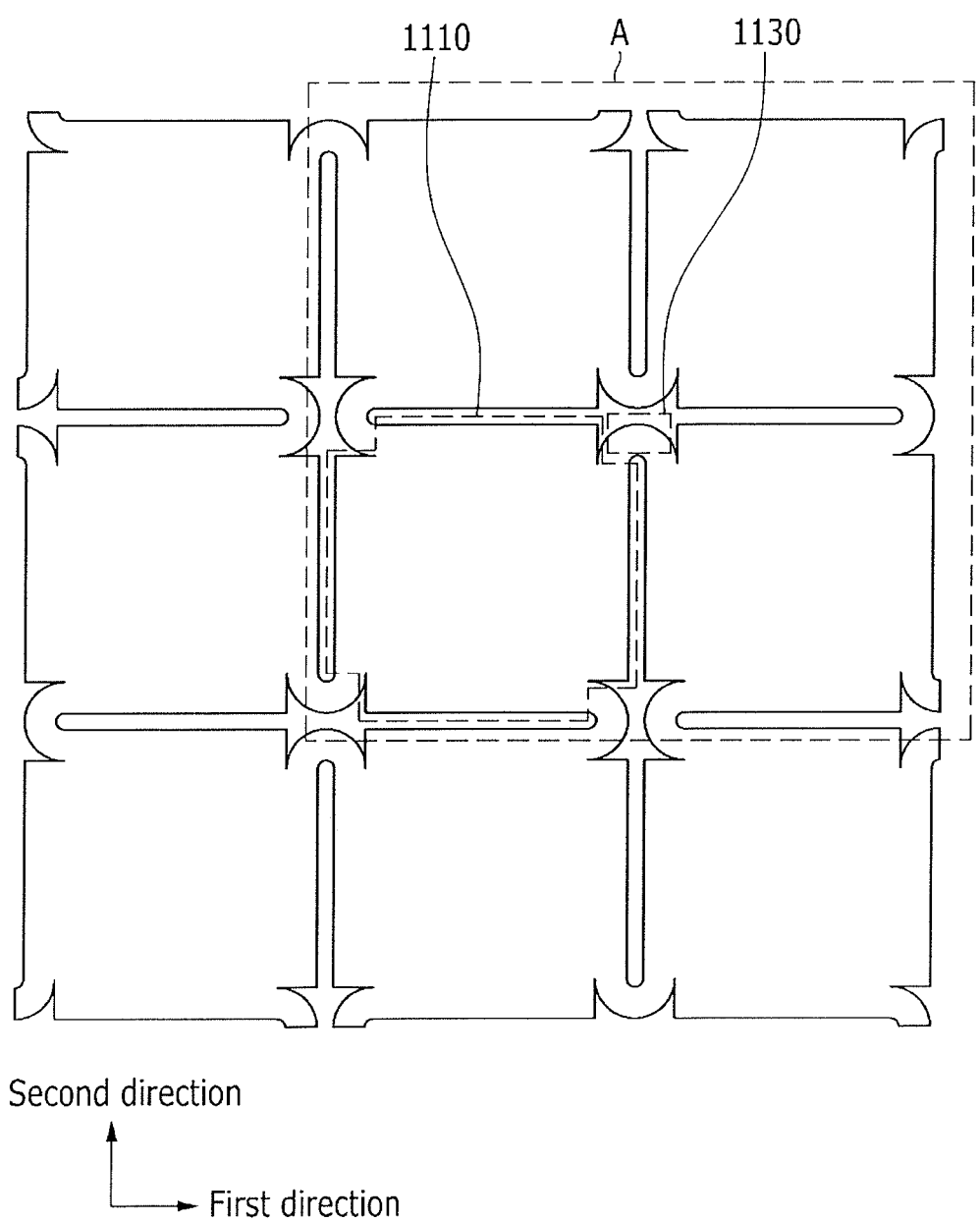
FIG. 3 illustrates a base layer according to the first embodiment.
Figure 4:
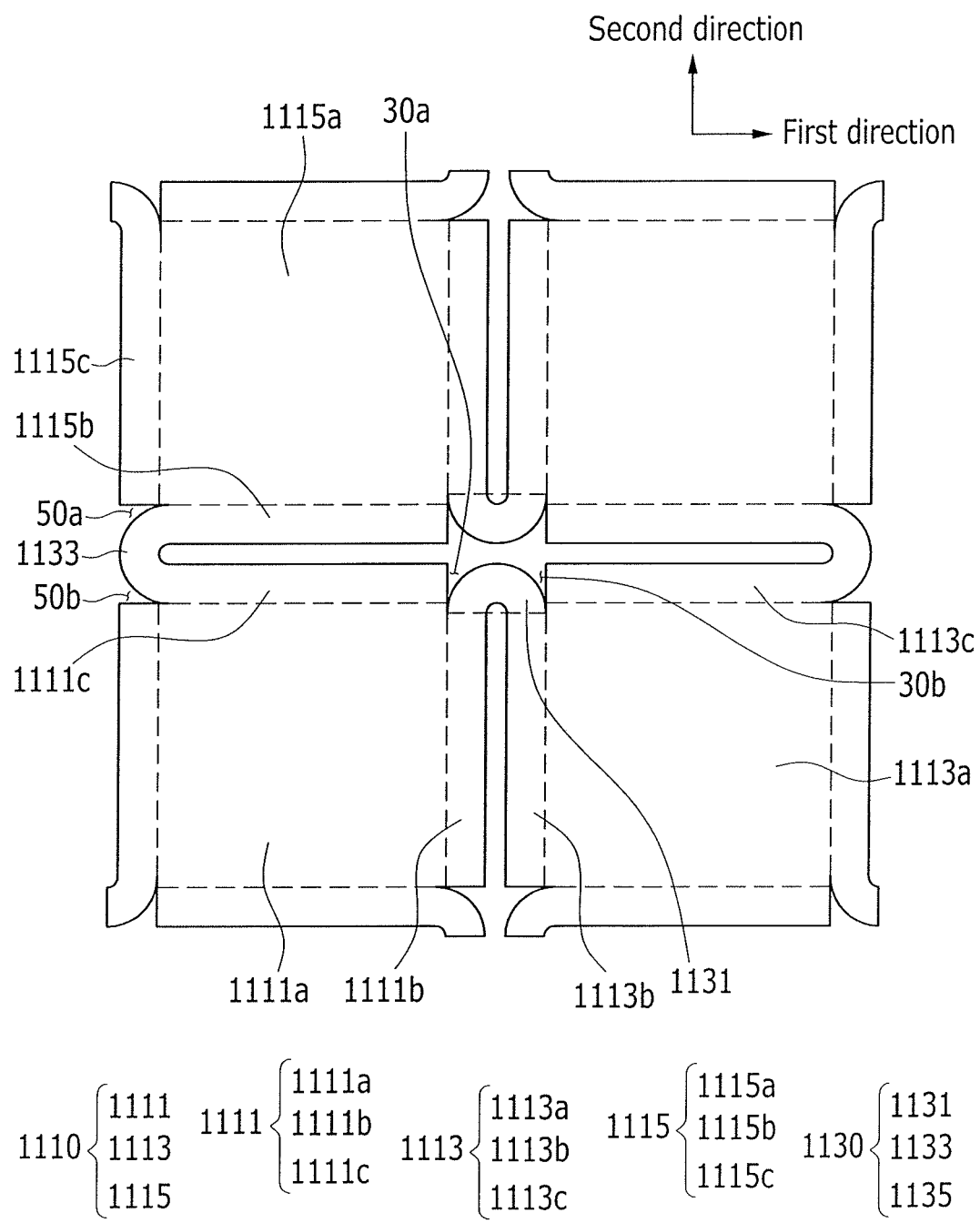
FIG. 4 illustrates an enlarged view of area A in FIG. 3.
Figure 5:
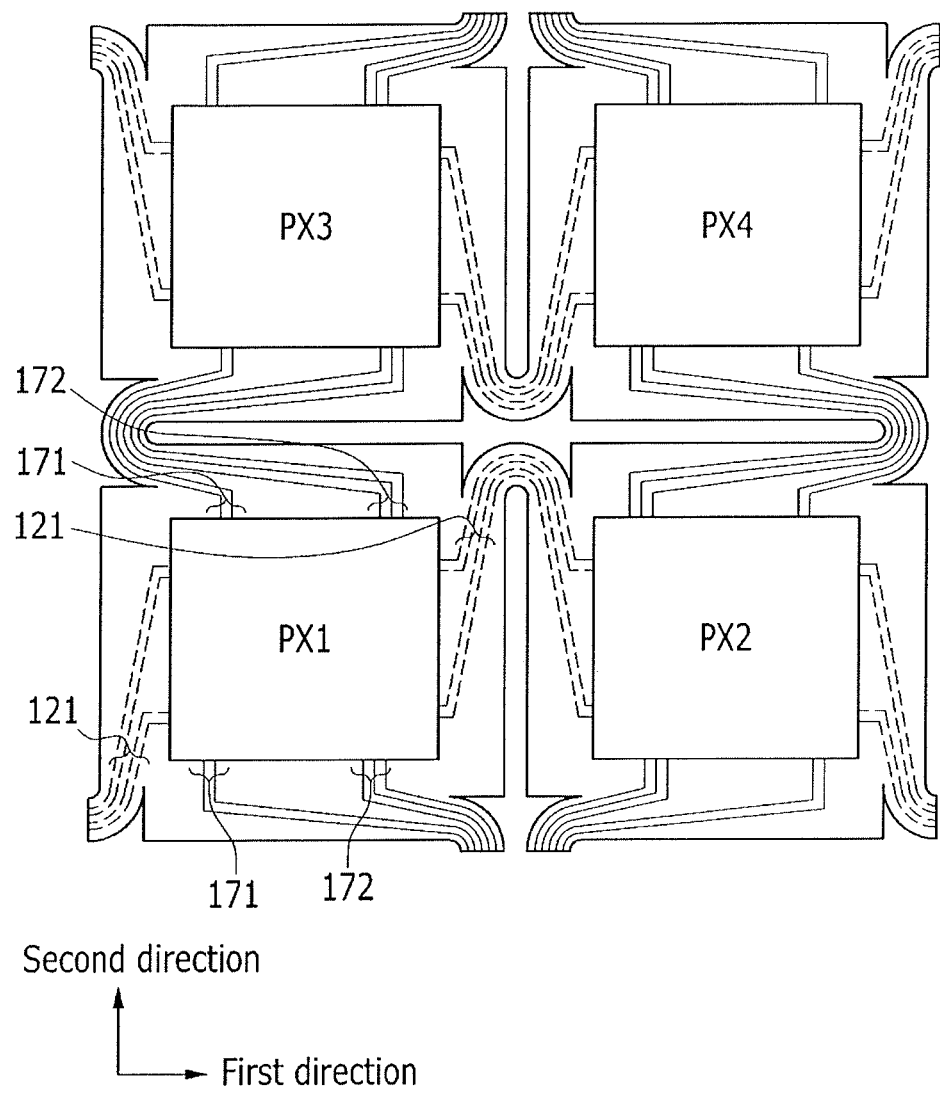
FIG. 5 illustrates an example of first to a third wires connected to the pixel.

FIG. 1 illustrates an embodiment of an OLED display, FIG. 2 illustrates a cross-sectional view of an embodiment of a pixel (PX) structure, FIG. 3 is a top plan view of an embodiment of a base layer of the OLED display, FIG. 4 illustrates an enlarged view of area A in FIG. 3, and FIG. 5 illustrates an example of first to a third wires connected to pixels on a base layer in FIG. 4.

In FIGS. 1 and 2, the OLED display includes a stretchable substrate 100 having an island (IS) shape, and a pixel (PX) structure on the stretchable substrate 100. The pixel (PX) structure represents a remaining configuration of the OLED display, except for the substrate 100.

Referring to FIG. 1, the substrate 100 has a structure for supporting pixel. As a stretchable substrate, the substrate 100 may be extended or contract in at least one direction. The substrate 100 has an island shape, where, for example, plurality of islands (IS) are spaced apart from each other at a predetermined distance P. When the substrate 100 is stretched, the distance P between the islands IS increases or decreases. However, even though the substrate 100 is stretched, each of the islands (IS) is not modified, e.g., a width and/or height of each of the islands IS does not increase or decrease.

In addition, even though the substrate 100 is stretched, the pixel PX structures on the islands IS are not modified. However, bridges BR connecting the pixel PX structures to each other, and areas CN in which the bridges and the pixels PX are connected, may be modified.

Referring to FIG. 2, the pixel PX on the substrate 100 includes a base layer 110, a thin film transistor, a first electrode, an emission layer, a second electrode, and the like. The base layer 110 is on the substrate 100. For example, the base layer 110 is on each of the islands on the substrate 100. In this case, the base layer 110 is formed is stretchable together with the substrate 100 when the substrate 100 is stretched.

Referring to FIG. 3, the base layer 110 includes a plurality of pixel forming plates 1110 and bridges 1130. The pixel forming plates 1110 are respectively disposed on the islands IS of the substrate 100. The pixel forming plates 1110 may be disposed in a lattice shape. Each of pixels PX may be formed on each of the pixel forming plates 1110. The bridges 1130 connect the pixel forming plates 1110 to each other. In this case, a plurality of pixels may be formed on each of the pixel forming plates 1110.

Each of the pixels may include a pixel circuit for driving an organic light emitting element. The pixel circuit may include, for example, a thin film transistor and a storage capacitor Cst for driving a pixel.

Each of the pixel forming plates 1110 may have a shape corresponding to a sectional shape of the island IS of the substrate 100. In one embodiment, the pixel forming plate 1110 may have substantially a quadrangular shape. The pixel forming plate 1110 may have a different shape in another embodiment, e.g., polygonal shape, such as a circular, triangular, or pentagonal shape corresponding to a sectional shape of the island IS of the substrate 100.

Referring to FIG. 4, an enlarged view of area A in FIG. 3 includes first and second pixel forming plates 1111 and 1113 of the pixel forming plate 1110 arranged in a first direction. First and third pixel forming plates 1111 and 1115 are arranged in a second direction perpendicular to the first direction. The first and second pixel forming plates 1111 and 1113 are connected by a first bridge 1131, and the first and third pixel forming plates 1111 and 1115 are connected by a second bridge 1133.

The first pixel forming plate 1111 includes a first main supporting plate 1111a, and first and second wing plates 1111b and 1111c. The first main supporting plate 1111a is in a center area of the first pixel forming plate 1111. A thin film transistor, an organic light emitting element are formed on the first main supporting plate 1111a. The first main supporting plate 1111a may have substantially a quadrangular shape.

The first and second wing plates 1111b and 1111c are formed on lateral surfaces of the first pixel forming plate 1111, and are combined with bridges connecting pixel forming plates to each other. The second wing plate 1111c is on the first main supporting plate 1111a and adjacent to the first wing plate 1111b. In FIG. 4, a dotted line between the first main supporting plate 1111a and the first and second wing plates 1111b and 1111c is a virtual line distinguishing the main supporting plate and the wing plate.

In addition to the first and second wing plates 1111b and 1111c, an additional wing plate may be formed on a lateral surface of the first main supporting plate 1111a. As shown in FIG. 4, wing plates may be formed at right and left sides and upper and lower sides of the first main supporting plate 1111a. Four wing plates may be formed on the first main supporting plate 1111a. In this case, the four wing plates are respectively disposed on respective lateral surfaces of the quadrangular first main supporting plate 1111a. The wing plate formed on the pixel forming plate may have substantially a quadrangular shape.

In addition, the second pixel forming plate 1113 includes a second main supporting plate 1113a, and third and fourth wing plates 1113b and 1113c. Like the first main supporting plate 1111a, the second main supporting plate 1113a is in a center area of the second pixel forming plate 1113. A thin film transistor, an organic light emitting element, and the like, are formed on the second main supporting plate 1113a. The second main supporting plate 1113a have substantially a quadrangular shape.

The third and fourth wing plates 1113b and 1113c are on lateral surfaces of the second pixel forming plate 1113, and are combined with bridges connecting pixel forming plates to each other. The third wing plate 1113b is on a lateral surface of the second main supporting plate 1113a to face the first wing plate 1111b of the first pixel forming plate 1111. The fourth wing plate 1113c is on the second main supporting plate 1113a and adjacent to the third wing plate 1113b.

In addition to the third and fourth wing plates 1113b and 1113c, an additional wing plate may be formed on the lateral surface of the second main supporting plate 1113a. As shown in FIG. 4, similar to the first main supporting plate 1111a, wing plates may be formed at right and left sides and upper and lower sides of the second main supporting plate 1113a. Four wing plates may be formed on the second main supporting plate 1113a. In this case, the four wing plates are disposed on respective lateral surfaces of the quadrangular second main supporting plate 1113a. The wing plate formed on the pixel forming plate may have substantially a quadrangular shape.

The third pixel forming plate 1115 include a third main supporting plate 1115a, and fifth and sixth wing plates 1115b and 1115c. Like the first main supporting plate 1111a, the third main supporting plate 1115a is in a center area of the third pixel forming plate 1115, and a thin film transistor, an organic light emitting element, and the like, are on the third main supporting plate 1115a. The third main supporting plate 1115a may have substantially a quadrangular shape.

The fifth and sixth wing plates 1115b and 1115c are on lateral surfaces of the third pixel forming plate 1115, and are combined with bridges connecting pixel forming plates to each other. The fifth wing plate 1115b is on a lateral surface of the third main supporting plate 1115a to face the second wing plate 1111c of the first pixel forming plate 1111. The sixth wing plate 1115c is on the third main supporting plate 1115a and adjacent to the fifth wing plate 1115b.

In addition to the fifth and sixth wing plates 1115b and 1115c, an additional wing plate may be formed on the lateral surface of the third main supporting plate 1115a. As shown in FIG. 4, similar to the first main supporting plate 1111a, wing plates may be formed at right and left sides and upper and lower sides of the third main supporting plate 1115a. Four wing plates may be formed on the third main supporting plate 1115a. In this case, the four wing plates are disposed on respective lateral surfaces of the quadrangular third main supporting plate 1115a.

In one embodiment, the first wing plate 1111b of the first pixel forming plate 1111 and the third wing plate 1113b of the second pixel forming plate 1113 are connected by the first bridge 1131. The first bridge 1131 is combined with the same side end portions of the first wing plate 1111b and the third wing plate 1113b.

The first bridge 1131 may have a curved shape, e.g., a bent shape. The first bridge 1131 may have a predetermined constant width. In one embodiment the first bridge 1131 may have a predetermined radius of curvature. In this case, the shape of the first bridge 1131 is modified when the substrate 100, that is disposed below the first bridge 1131, is stretched.

Figure 6:
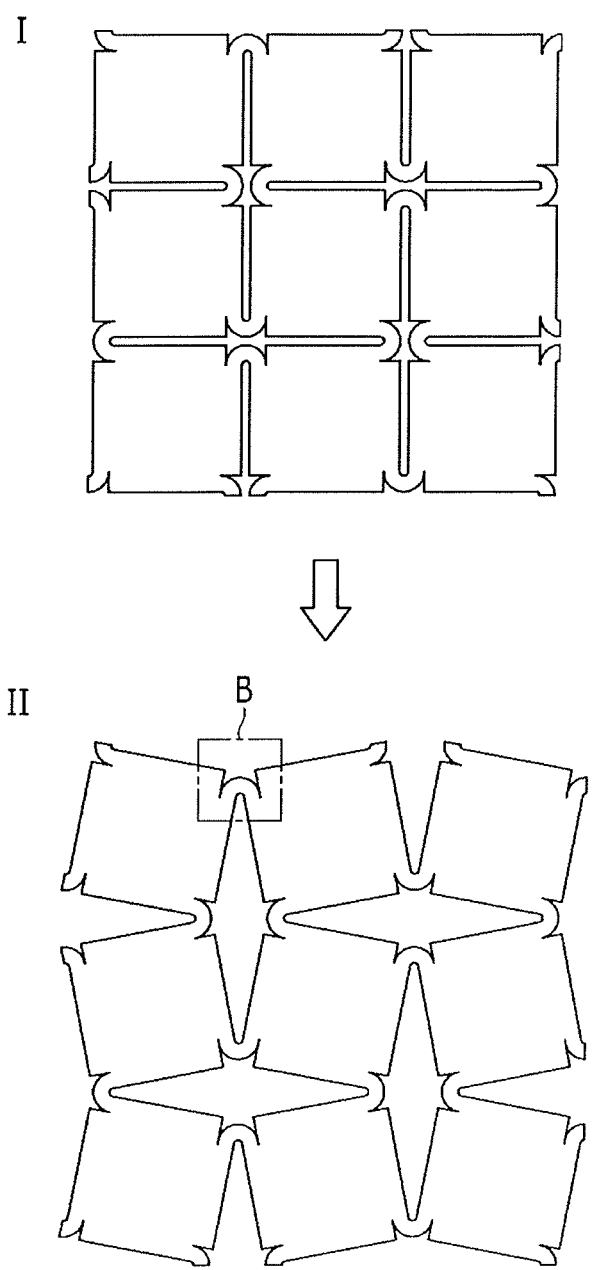
FIG. 6 illustrates an example for expanding the base layer.

Referring to FIG. 6, when the substrate 100 is stretched, each of the pixel forming plates on the island IS of the substrate 100 is moved in one direction, and a shape of the first bridge 1131 connecting the first and second pixel forming plates 1111 and 1113 is modified. In this case, the radius of curvature of the first bridge 1131 increases so that the area of the base layer 110 may be expanded or a length thereof may extend in one direction.

Referring again to FIG. 4, the second wing plate 1111c of the first pixel forming plate 1111 and the fifth wing plate 1115b of the third pixel forming plate 1115 are connected by the second bridge 1133. The second bridge 1133 is combined with the same side end portions of the second wing plate 1111c and the fifth wing plate 1115b.

Like the first bridge 1131, the second bridge 1133 may be curved. In this case, the second bridge 1133 may have a predetermined width. In one embodiment, the second bridge 1133 may have a predetermined radius of curvature.

Like the first bridge 1131, the shape of the second bridge 1133 is modified when the substrate 100, that is disposed below the second bridge 1133, is stretched. When the substrate 100 is stretched, the shape of the second bridge 1133 connecting the first and third pixel forming plates 1111 and 1115 is modified. In this case, the radius of curvature of the second bridge 1133 increases, so that the area of the base layer 110 may be expanded or the length thereof may extend in one direction.

In one embodiment, a first cut-out groove 30a is formed in the first pixel forming plate 1111 to be adjacent to an area connected with the first bridge 1131. For example, the first cut-out groove 30a may be formed between the first pixel forming plate 1111 and the first bridge 1131.

More specifically, the first cut-out groove 30a may be formed between one side end portion of the second wing plate 1111c of the first pixel forming plate 1111 and the first bridge 1131. The first cut-out groove 30a may prevent the base layer from being broken due to stress occurring between one side end portion of the second wing plate 1111c and the first bridge 1131.

In FIG. 4, if the first cut-out groove 30a is not formed between the second wing plate 1111c of the first pixel forming plate 1111 and the first bridge 1131, and the same material as the second wing plate 1111c and the first bridge 1131 is filled in a region of the first cut-out groove 30a, the first bridge 1131 may be modified so that stress may be concentrated on the region. Accordingly, a crack may occur in the region. Further, a pixel laminated on the first pixel forming plate 1111 may be damaged.

In addition, a second cut-out groove 30b is formed in the second pixel forming plate 1113 to be adjacent to an area connected with the first bridge 1131. For example, the second cut-out groove 30b may be formed between the second pixel forming plate 1113 and the first bridge 1131.

More specifically, the second cut-out groove 30b may be formed between one side end portion of the fourth wing plate 1113c of the second pixel forming plate 1113 and the first bridge 1131. Similar to the first cut-out groove 30a, the second cut-out groove 30b may prevent the base layer from being broken due to stress occurring between one side end portion of the fourth wing plate 1113c and the first bridge 1131.

In addition, similar to the first and second cut-out grooves 30a and 30b described above, a fourth cut-out groove 50b may be formed in the first pixel forming plate 1111 to be adjacent to an area connected with the second bridge 1133. Further, a third cut-out groove 50a may be formed in the third pixel forming plate 1115 to be adjacent to an area connected with the second bridge 1133.

Referring to FIG. 5, one pixel PX1, PX2, PX3, or PX4 may be formed on each of the pixel forming plates 1110 of the base layer. Each pixel PX1, PX2, PX3, or PX4 may include a plurality of subpixels, e.g., a red subpixel (R), a green subpixel (G), and blue subpixel (B).

Figure 9:
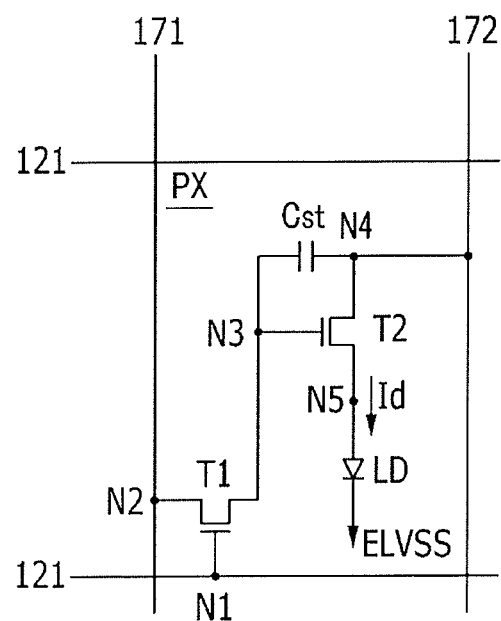
FIG. 9 illustrates an example of a pixel circuit.
Figure 10:
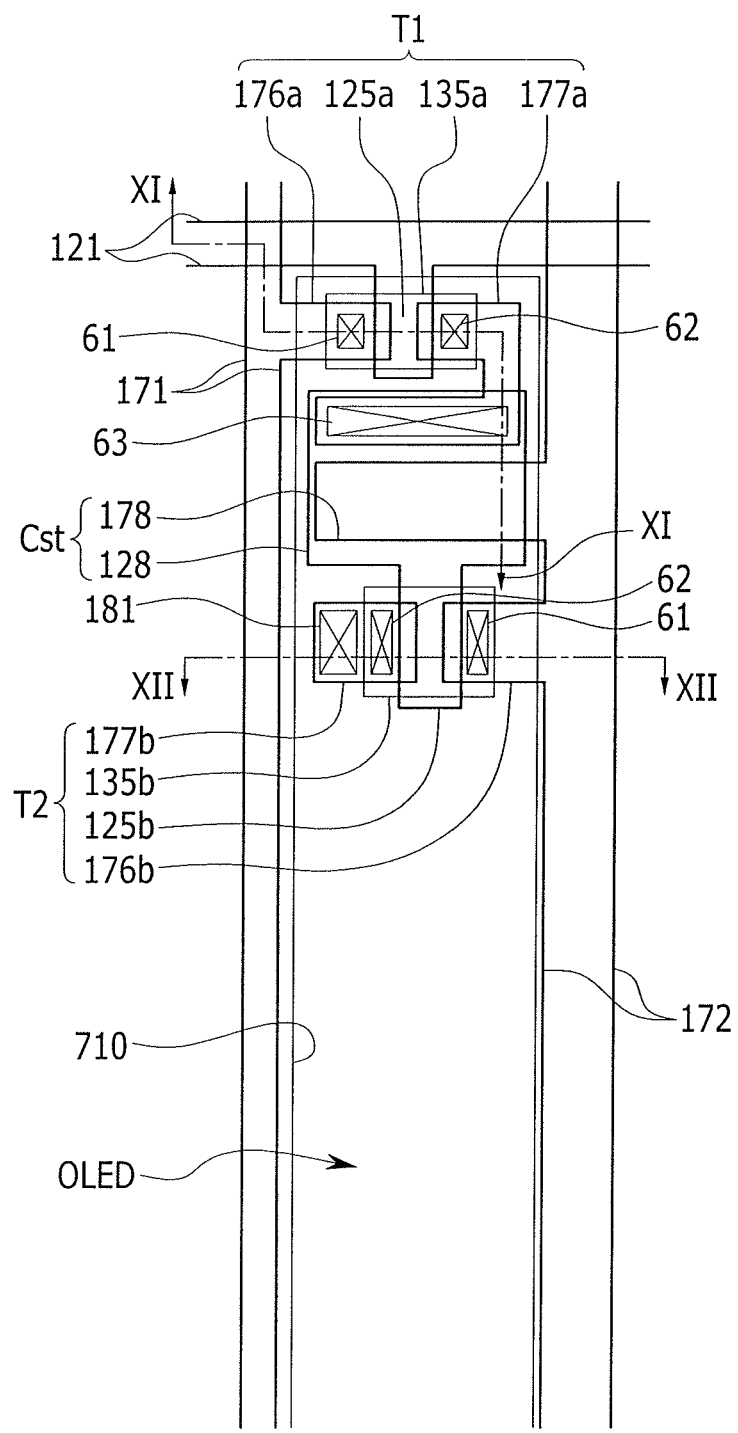
FIG. 10 illustrates a layout embodiment of a pixel.
Figure 11:
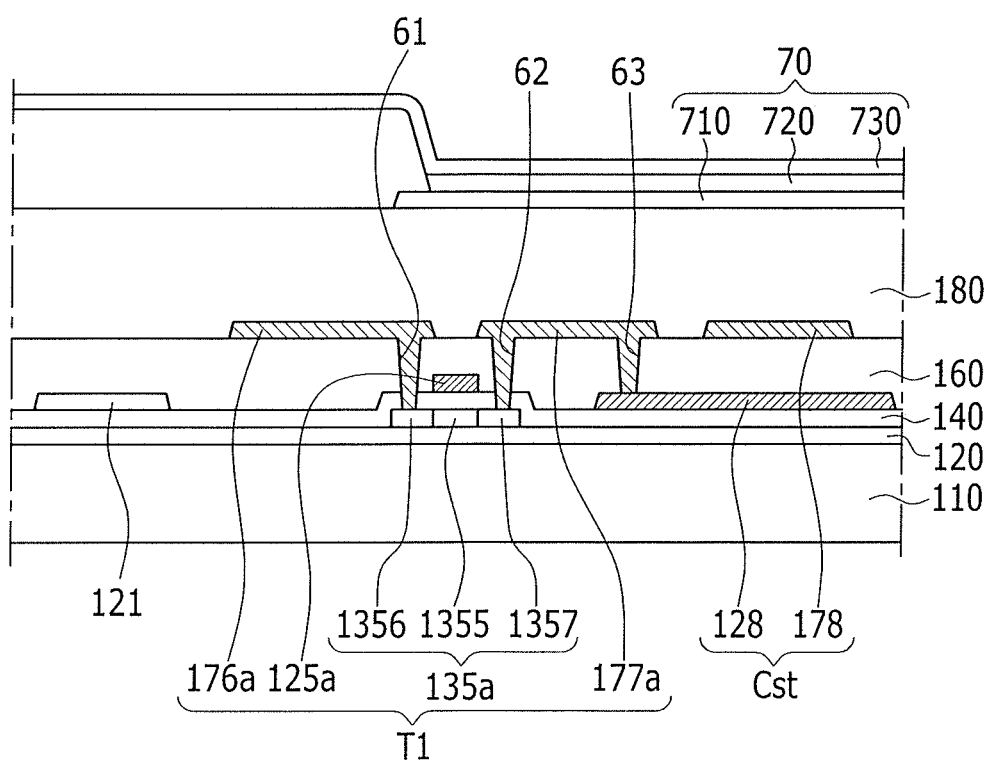
FIG. 11 illustrates a view along section line XI-XI in FIG. 10.
Figure 12:
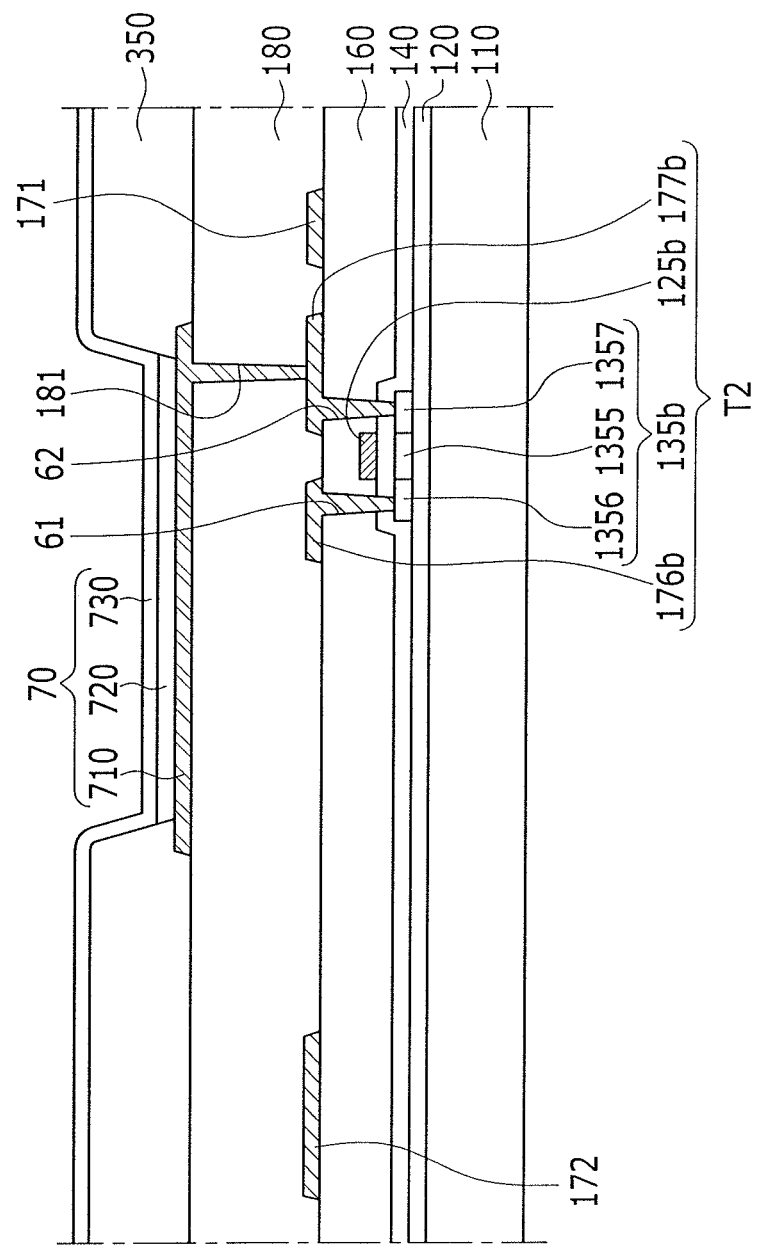
FIG. 12 illustrates a view along section line XII-XII in FIG. 10.

FIG. 9 illustrates an embodiment of a pixel, or subpixel, in the OLED display. FIG. 10 illustrates a layout embodiment of the pixel. FIG. 11 is a cross-sectional view of FIG. 10 taken along line XI-XI. FIG. 12 is a cross-sectional view of FIG. 10 taken along line XII-XII.

An equivalent circuit diagram of one pixel or subpixel, on each of the pixel forming plates 1110 will be described with reference to FIG. 9. The OLED display includes a plurality of signal lines 121, 171, and 172, and subpixels connected thereto. In this case, the subpixels may be any one of a red pixel R, a green pixel G, and a blue pixel B. As described above, the pixel PX1, PX2, PX3, or PX4 each of the pixel forming plates 1110 may include a plurality of subpixels.

The signal lines include gate lines 121 for transmitting a scanning signal, data lines 171 for transmitting a data signal, a driving voltage line 172 for transmitting a driving voltage. The gate lines 121 substantially extend in a row direction and are nearly parallel to each other. The data lines 171 substantially extend in a column direction and are nearly parallel to each other. The driving voltage lines 172 are illustrated to substantially extend in the column direction, but may extend in the row or column direction or have a net-like shape.

A single subpixel includes a thin film transistor including a switching transistor T1 and a driving transistor T2, a storage capacitor Cst, and an organic light emitting element LD. One pixel PX, or subpixel, may include a thin film transistor and a capacitor to compensate a current supplied to the organic light emitting element LD.

The switching transistor T1 includes a control terminal N1, an input terminal N2, and an output terminal N3. The control terminal N1 is connected to the gate line 121, the input terminal N2 is connected to the data line 171, and the output terminal N3 is connected to the driving transistor T2.

The switching transistor T1 transmits the data signal from the data line 171 to the driving transistor T2 based on the scanning signal transmitted via the gate line 121.

The driving transistor T2 includes a control terminal N3, an input terminal N4, and an output terminal N5. The control terminal N3 is connected to the switching transistor T1, the input terminal N4 is connected to the driving voltage line 172, and the output terminal N5 is connected to the organic light emitting element LD. The driving transistor T2 outputs an output current Id in an amount which varies according to a voltage applied between the control terminal N3 and the output terminal N5.

In this case, the capacitor Cst is connected between the control terminal N3 and the input terminal N4 of the driving transistor T2. The capacitor Cst is charged with a data signal applied to the control terminal N3 of the driving transistor T2, and maintains the data signal even after the switching transistor T1 is turned off.

For example, as an organic light emitting diode (OLED), the organic light emitting element LD has an anode connected to the output terminal N5 of the driving transistor T2 and a cathode connected to a common voltage Vss. The organic light emitting element LD emits light of varying intensities according to the output current Id of the driving transistor T2.

The organic light emitting element LD may include an organic material that represents one or more primary colors, e.g., red, green, and blue. The OLED display displays a desired image with a spatial sum of these colors.

The switching transistor T1 and the driving transistor T2 are n-channel electric effect transistors (FETs), but at least one of them may be a p-channel FET. In addition, a connection relationship between the transistors T1 and T2, the capacitor Cst, and the organic light emitting element LD may be different in another embodiment.

The OLED display formed on each of the pixel forming plates 1110 will be described more fully with reference to FIGS. 10 to 12. As described above, the base layer 110 is on the substrate 100 and may include, for example, polyamide, polyamide, polyacrylates, or the like.

A buffer layer 120 is formed on the base layer 110. The buffer layer 120 may be formed as a single layer of a silicon nitride ($SiN_x$) or as a dual-layer in which a silicon nitride ($SiN_x$) and a silicon oxide ($SiO_x$) are laminated. The buffer layer 120 serves to flatten a surface while preventing permeation of unnecessary materials such as impurities or moisture.

A switching semiconductor layer 135*a* and a driving semiconductor layer 135*b* are formed on the buffer layer 120 and separated from each other. These semiconductor layers 135*a* and 135*b* may include, for example, polysilicon or an oxide semiconductor. The oxide semiconductor may include, for example, an oxide based on titanium (Ti), hafnium (Hf), zirconium (Zr), aluminum (Al), tantalum (Ta), germanium (Ge), zinc (Zn), gallium (Ga), tin (Sn), or indium (In), and complex oxides thereof such as zinc oxide (ZnO), indium-gallium-zinc oxide ($InGaZnO_4$), indium-zinc oxide (Zn—In—O), zinc-tin oxide (Zn—Sn—O), indium-gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium-aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium-gallium oxide (In—Ge—Ga—O), titanium-indium-zinc oxide (Ti—In—Zn—O), and hafnium-indium-zinc oxide (Hf—In—Zn—O).

When the semiconductor layers 135*a* and 135*b* include an oxide semiconductor material, a separate passivation layer may be added to protect the oxide semiconductor from environmental influences, e.g., high temperature or the like.

The semiconductor layers 135*a* and 135*b* include a channel region where impurities are not doped. Source and drain regions are at opposite sides of the channel region where the impurities are doped. The doped impurities may be different depending on the type of the thin film transistor and may, for example, include n-type or p-type impurities.

The switching semiconductor layer 135*a* and the driving semiconductor layer 135*b* are divided into channel regions 1355 and source and drain regions 1356 and 1357 respectively formed at opposite sides of the channel region 1355. The channel regions 1355 of the switching semiconductor layer 135*a* and the driving semiconductor layer 135*b* may include polysilicon that is not doped with the impurities, e.g., may be an intrinsic semiconductor.

The source and drain regions 1356 and 1357 of the switching semiconductor layer 135*a* and the driving semiconductor layer 135*b* may include polysilicon doped with conductive impurities, e.g., may be an impurity semiconductor.

A gate insulating layer 140 is on the switching semiconductor layer 135*a* and the driving semiconductor layer 135*b*. The gate insulating layer 140 may be a single layer or multiple layers including, for example, at least one of a silicon nitride or a silicon oxide.

A gate line 121, a driving gate electrode 125*b*, and a first capacitor electrode 128 are on the gate insulating layer 140. The gate line 121 extends in a horizontal direction and transmits a scan signal to a switching transistor T1. The gate line 121 includes a switching gate electrode 125*a* that protrudes toward switching semiconductor layer 135*a*.

The driving gate electrode 125*b* protrudes toward the driving semiconductor layer 135*b* from the first capacitor electrode 128. Each of the switching gate electrode 125*a* and the driving gate electrode 125*b* overlap the channel region 1355.

An interlayer insulating layer 160 is on the gate line 121, the driving gate electrode 125*b*, and the first capacitor electrode 128. The interlayer insulating layer 160 may include, for example, a silicon nitride, a silicon oxide, or the like, as is the gate insulating layer 140.

In the interlayer insulating layer 160 and the gate insulating layer 140, a source contact hole 61 and a drain contact hole 62 are formed to respectively expose the source region 1356 and the drain region 1357. A storage contact hole 63 is formed to expose some of the first capacitor electrode 128.

A data line 171 having a switching source electrode 176a, a driving voltage line 172 having a driving source electrode 176b and a second capacitor electrode 178, and a switching drain electrode 177a and a driving drain electrode 177b connected to the first capacitor electrode 128 are formed on the interlayer insulating layer 160.

The data line 171 transmits a data signal and extends to cross the gate line 121. The driving voltage line 172 transmits a driving voltage and is separated from the data line to extend in the same direction as the data line 171.

The switching source electrode 176a protrudes toward the switching semiconductor layer 135a from the data line 171. The driving source electrode 176b protrudes toward the driving semiconductor layer 135b from driving voltage line 172. Each of the switching source electrode 176a and the driving source electrode 176b is connected to the source region 1356 through the source contact hole 61. The switching drain electrode 177a faces the switching source electrode 176a, and the driving drain electrode 177b faces the driving source electrode 176b.

Each of the switching drain electrode 177a and the driving drain electrode 177b is connected to the drain region 1357 through the drain contact hole 62. The switching drain electrode 177a is extended to be electrically connected to the first capacitor electrode 128 and the driving gate electrode 125b through the contact hole 63 in the interlayer insulating layer 160.

The second capacitor electrode 178 protrudes from the driving voltage line 172 to overlap the first capacitor electrode 128. Accordingly, the first capacitor electrode 128 and the second capacitor electrode 178 form the storage capacitor Cst1, with the interlayer insulating layer 160 serving as a dielectric material.

The switching semiconductor layer 135a, the switching gate electrode 125a, the switching source electrode 176a, and the switching drain electrode 177a form a switching thin film transistor T1. Meanwhile, the driving semiconductor layer 135b, the driving gate electrode 125b, the driving source electrode 176b, and the driving drain electrode 177b form a driving thin film transistor T2. The switching thin film transistor T1 and the driving thin film transistor T2 correspond to switching elements.

A passivation layer 180 is formed on the switching source electrode 176a, the driving source electrode 176b, the switching drain electrode 177a, and the driving drain electrode 177b.

A pixel electrode 710 is formed on the passivation layer 180. The pixel electrode 710 may include, for example, a transparent conductive material such as indium tin oxide (ITO), indium zinc oxide (IZO), zinc oxide (ZnO), indium oxide ($In_2O_3$), etc., or a reflective metal such as lithium, calcium, lithium fluoride/calcium, lithium fluoride/aluminum, aluminum, silver, magnesium, gold, etc.

The pixel electrode 710 is electrically connected to the driving drain electrode 177b of the driving thin film transistor T2 through a contact hole 181 in the interlayer insulating layer 160, and becomes an anode of the organic light emitting element 70.

A pixel definition layer 350 is formed on edge portions of the passivation layer 180 and the pixel electrode 710. The pixel definition layer 350 includes an opening that exposes the pixel electrode 710. The pixel definition layer 350 include a resin based on, for example, polyacrylates or polyimides, or a silica-based inorganic material.

An organic emission layer 720 is formed in the opening of the pixel definition layer 350. The organic emission layer 720 may be formed with multiple layers including a hole-injection layer (HIL), a hole-transporting layer (HTL), an electron-transporting layer (ETL), and/or an an electron-injection layer. When all of the above layers are included, the HIL may be disposed on the pixel electrode 710 serving as the anode, and the HTL, the emission layer, the ETL, and the EIL may be sequentially laminated thereon.

The organic emission layer 720 may include a red organic emission layer emitting red light, a green organic emission layer emitting green light, and/or a blue organic emission layer emitting blue light. The red organic emission layer, the green organic emission layer, and the blue organic emission layer are respectively formed on a red pixel, a green pixel, and a blue pixel to implement a color image.

The red organic emission layer, the green organic emission layer, and the blue organic emission layer may be integrally laminated on the organic emission layer 720 together with the red pixel, the green pixel, and the blue pixel to respectively form a red color filter, a green color filter, and a blue color filter in each pixel, to thereby implement a color image.

In another embodiment, a white organic emission layer emitting white light is formed on all of the red pixel, the green pixel, and the blue pixel. A red color filter, a green color filter, and a blue color filter may be respectively formed for these pixels to implement a color image. When the color image is implemented using the white organic emission layer and the color filter, a deposition mask for depositing the red organic emission layer, the green organic emission layer, and the blue organic emission layer on individual pixels, that is, the red pixel, the green pixel, and the blue pixel, is not required.

In another embodiment, the white organic emission layer may be formed to have a single organic emission layer, and may further include a configuration in which a plurality of organic emission layers are laminated to emit white light. For example, a configuration in which at least one yellow organic emission layer and at least one blue organic emission layer are combined to emit white light, a configuration in which at least one cyan organic emission layer and at least one red organic emission layer are combined to emit white light, and a configuration in which at least one magenta organic emission layer and at least one green organic emission layer are combined to emit white light, may be further included.

A common electrode 730 is formed on the pixel definition layer 350 and the organic emission layer 720. The common electrode 730 may include, for example, a transparent conductive material such as indium tin oxide (ITO), indium zinc oxide (IZO), zinc oxide (ZnO), indium oxide ($In_2O_3$), etc., or a reflective metal such as lithium, calcium, lithium fluoride/calcium, lithium fluoride/aluminum, aluminum, silver, magnesium, gold, etc. The common electrode 730 may be a cathode of the organic light emitting element 70. The pixel electrode 710, the organic emission layer 720, and the common electrode 730 form the organic light emitting element 70. An overcoat may be formed on the common electrode 730 to protect the organic light emitting element 70.

In one embodiment, first to third wires 121, 171, and 172 are connected to the pixel PX1, PX2, PX3, and PX4 on the pixel forming plates 1110, amd may be formed on the bridge 1130. For example, a plurality of wires connected to the pixel PX1, PX2, PX3, and PX4 may respectively extend to the pixel forming plates through the bridge.

Referring again to FIG. 5, the first wire 121 extends in the first direction through the pixel PX1 on the first pixel forming plate 1111. The first wire 121 is formed on the first bridge 1131 and may be connected to the pixel PX2 of the second pixel forming plate 1113. For example, the first wire 121 extends in the first direction through the first pixel forming plate 1111, the first bridge 1131, and the second pixel forming plate 1113.

In one embodiment, the first wire 121 may correspond to the aforementioned gate line 121 for transmitting the scanning signal. In FIG. 10, the gate line 121 substantially extends in the row direction and may correspond to the first wire 121. For example, the gate lines 121 may be respectively connected to the pixels through the bridges connecting the pixel forming plates.

The second and third wires 171 and 172 extend in the second direction through the pixel PX1 on the first pixel forming plate 1111 and may be formed on the second bridge 1133. The second and third wires 171 and 172 may be connected to the pixel PX3 of the third pixel forming plate 1115. For example, the second and third wires 171 and 172 extend through the first pixel forming plate 1111, the second bridge 1133, and the third pixel forming plate 1115.

In one embodiment, the second and third wires 171 and 172 may correspond to the aforementioned data line 171 for transmitting the data signal and the aforementioned driving voltage line 172 for transmitting the driving voltage, respectively. In FIG. 10, the data line 171 and the driving voltage line 172 substantially extend in the column direction and may correspond to the second and third wires 171 and 172, respectively. For example, the data line 171 and the driving voltage line 172 may be respectively connected to the pixels through the bridges connecting the pixel forming plates.

Figure 7:
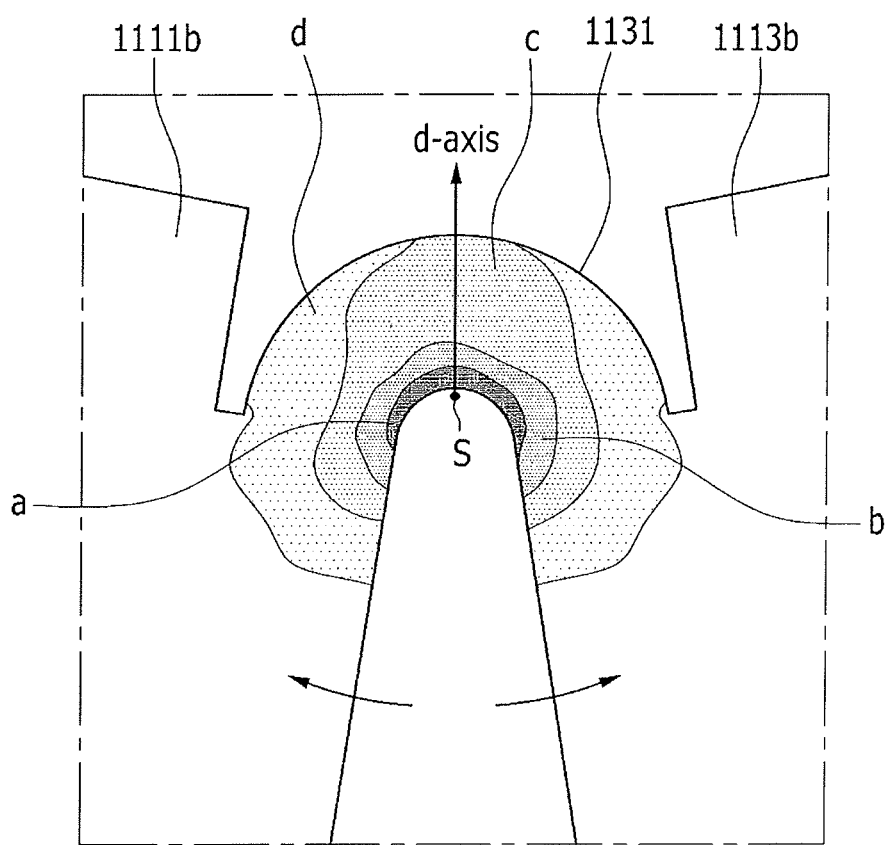
FIG. 7 illustrates an example of strain in area B of FIG. 6.
Figure 8:
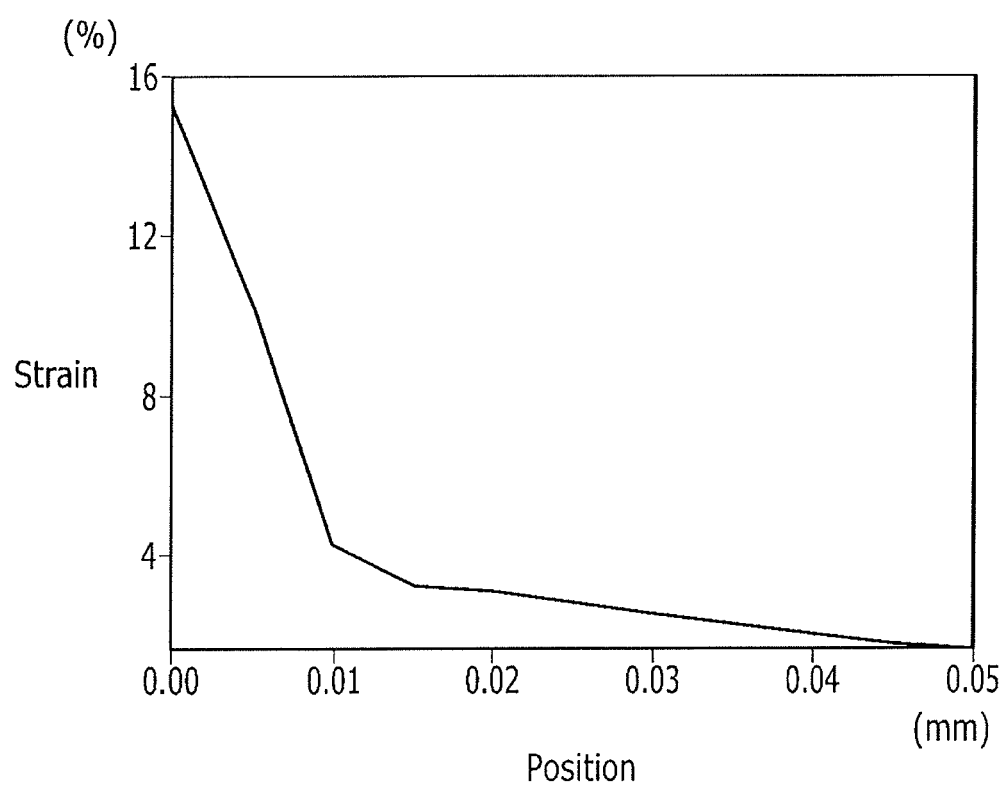
FIG. 8 illustrates an example of variation of strain based on position.

FIG. 7 illustrates an example of strain in area B of FIG. 6, and FIG. 8 is a graph illustrating an example of a variation of strain according to positions of a bridge. More specifically, FIG. 7 sets forth an example results for measuring strain occurring in a region of the first bridge 1131 when the first and second pixel forming plates 1111 and 1113 move in opposite side directions. FIG. 8 sets forth results for measuring the strain on the first bridge 1131 along a d-axis corresponding to an external circumference direction based on a reference point S.

Referring to FIG. 7, when the first and second pixel forming plates 1111 and 1113 move in opposite side directions, the strain occurring in the first bridge 1131 varies depending on position. The strain is a measure of the rate (%) of length variation per unit length. For example, respective areas a, b, c, and d in FIG. 7 are those where the strain is equal, and strain decreases from the area a toward the area b, the area c, and the area d.

The strain on the first bridge 1131 increases closer to the reference point S. That is, the strain increases closer to a center of the first bridge 1131 based on a predetermined radius of curvature. For example, based on a center line through a center of width of the first bridge 1131, strain on an inner side of the center line is greater than on an outer side thereof.

Referring to FIG. 8, the strain rapidly decreases closer to the outer side along the d-axis based on the reference point S in FIG. 7.

Based on the measured results in FIGS. 7 and 8, when the first and second pixel forming plates 1111 and 1113 move in opposite side directions, greater modification occurs in the inner side than the outer side in the first bridge 1131. Accordingly, the first wire 121 formed on the bridge 1130 may be disposed at the outer side of the bridge 1130 based on the center line.

Figure 13:
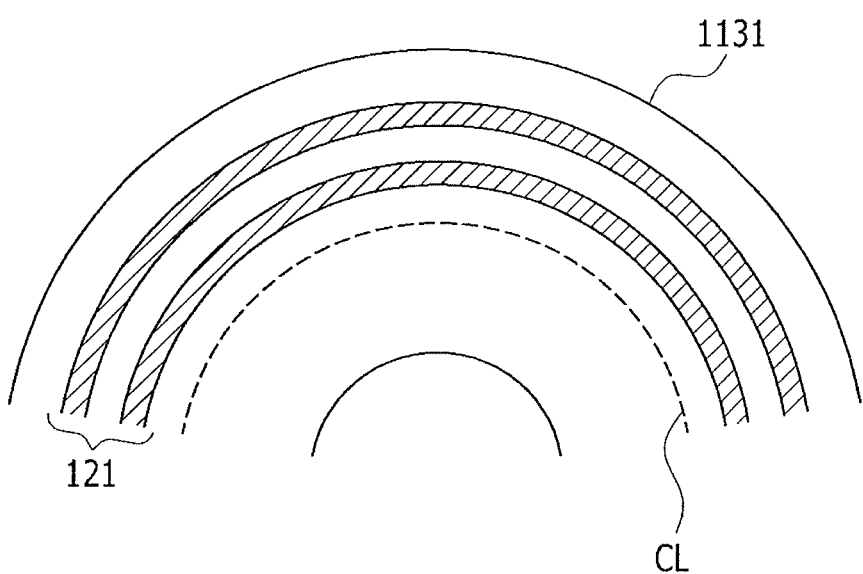
FIGS. 13 to 17 illustrate layout embodiments of wires in a bridge area.

Referring to FIG. 13, the first wires 121 may be disposed at the outer side of a center line CL based on the center line CL through the center of the width of the first bridge 1131. As described above, since the first wires 121 are disposed at the outer side in which strain is relatively small, the first wire 121 may be prevented from being cut or cracked due to repetitive moving of the first and second pixel forming plates 1111 and 1113.

In one embodiment, the first wires 121 may be uniformly disposed in the bridge 1130. However, dummy wires 800 may be in the inner side of the center line CL. In this case, strain on the dummy wire 800 may be greater than that on the first wire 121.

Figure 14:
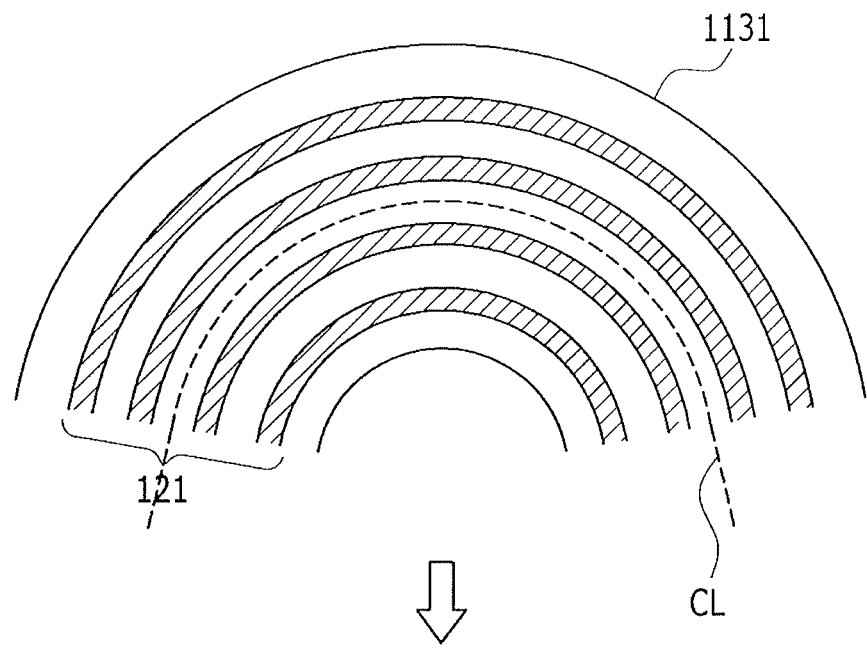
Figure 14:
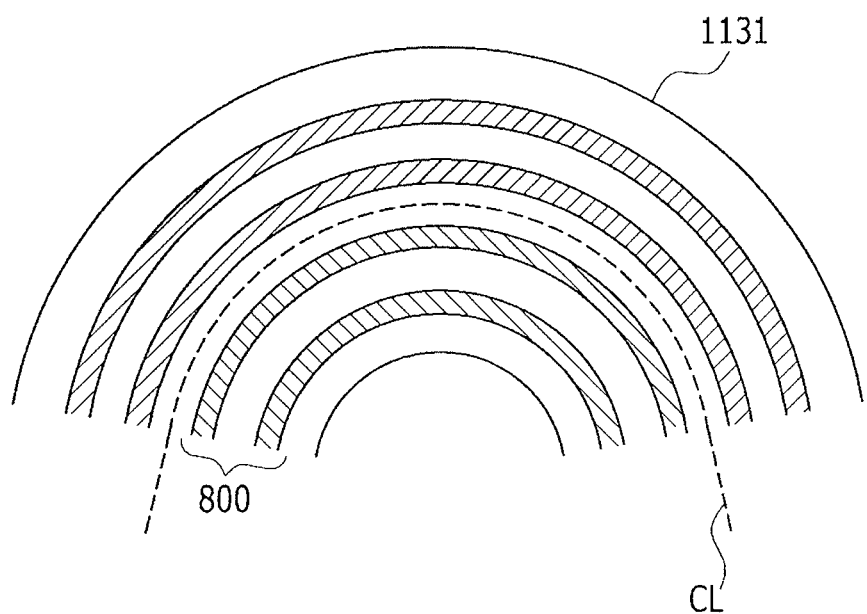
Figure 15:
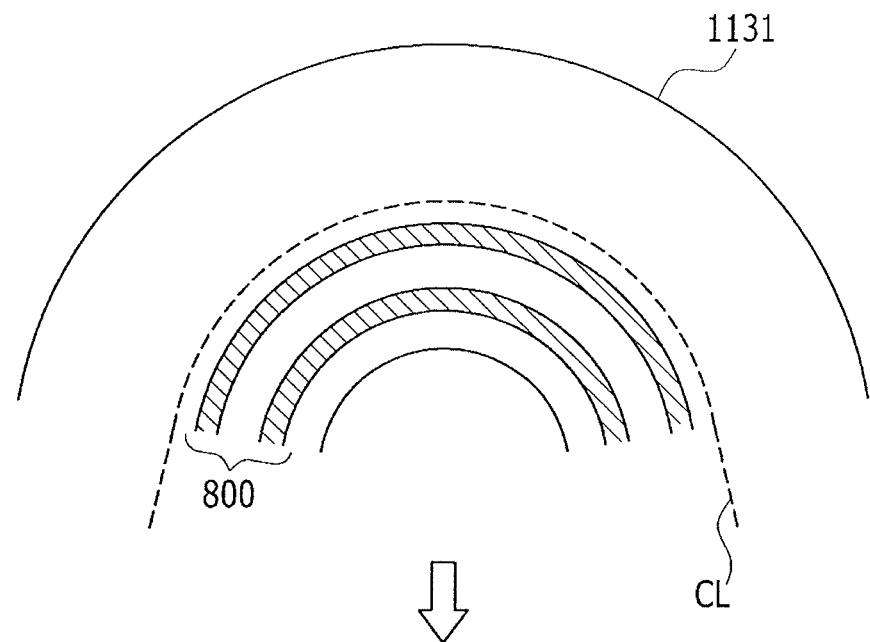
Figure 15:
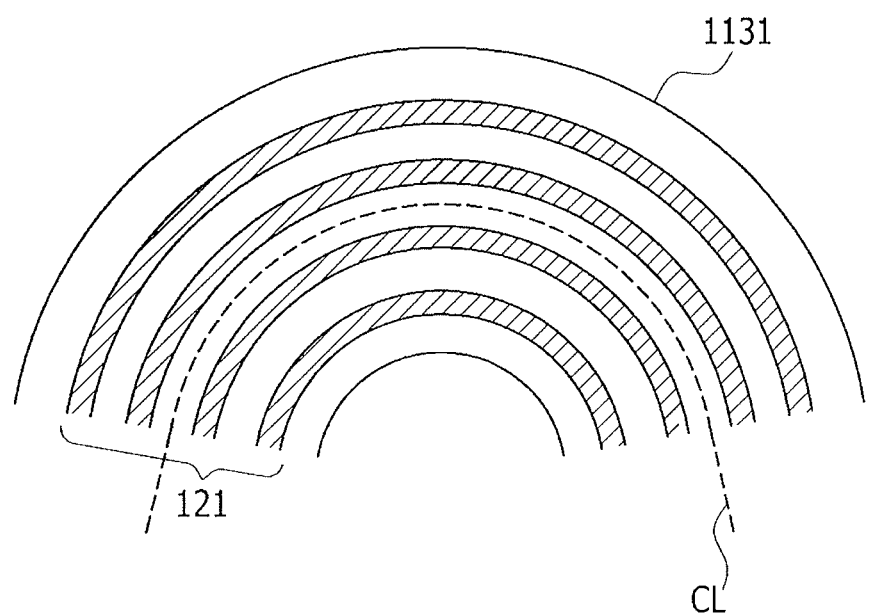

Referring to FIGS. 14 and 15, the dummy wires 800 may be above or below of the first wires 121 in the inner side of the center line CL. For example, as shown in FIG. 14, the first wires 121 may be uniformly laminated, and a dummy wire 800 may be additionally laminated on the first wires 121 in the inner side of the center line CL. Further, as shown in FIG. 15, the dummy wires 800 are laminated in the inner side of the center line CL, and the first wires 121 may be uniformly laminated above the dummy wires 800.

Figure 16:
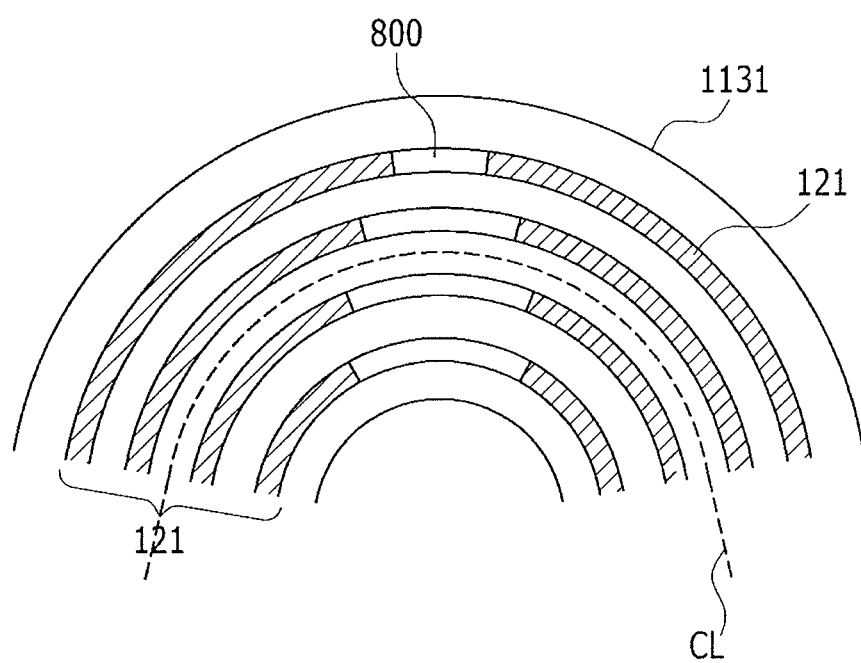

In one embodiment, the first wires 121 may be uniformly above the bridge 1130. However, as shown in FIG. 16, dummy wires 800 may be additionally disposed in center areas of the bridge 1130. Length of the dummy wires 800 become shorter from the inner side of the bridge 1130 toward the outer side thereof. Further, strain on the dummy wire 800 is greater than that on the first wire 121. The inner side of the bridge 1130 is an area in which a center of a curvature radius of a curved bridge 1130 is positioned, and the outer side of the bridge 1130 is a remaining area except for the center area.

In one embodiment, among the second and third wires 171 and 172 on the bridge 1130, a wire that has relatively small strain is in the outer side of the center line CL. Further, among the second and third wires 171 and 172, a wire that has relatively greater strain is in the inner side of the center line CL. Accordingly, since the wire with the relatively greater strain is disposed in the inner side of the center line CL and the wire with the relatively small strain is disposed in the outer side of the center line CL, the second and third wires 171 and 172 may be prevented from being cut or cracked due to repetitive moving of the first and second pixel forming plates 1111 and 1113.

Figure 17:
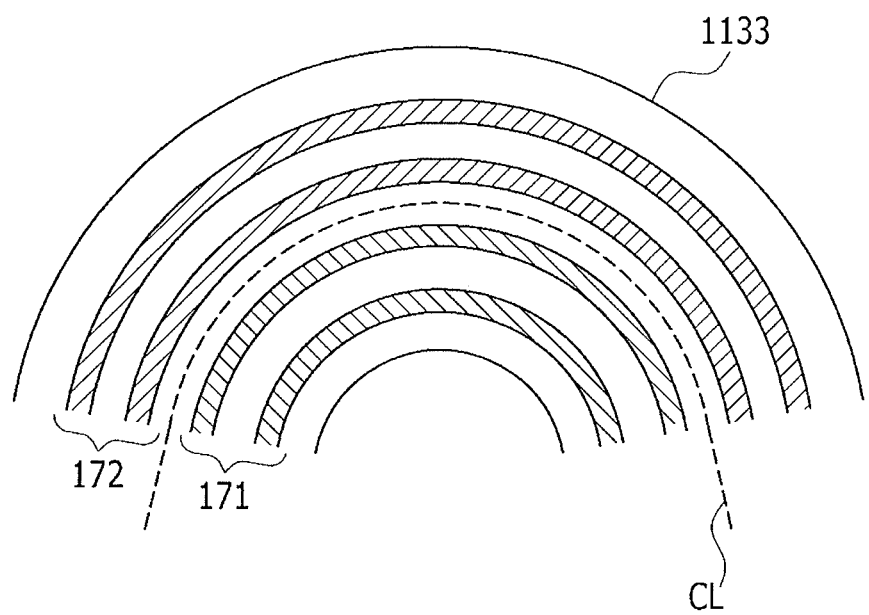

For example, referring to FIG. 17, the second wires 171 may be disposed in the inner side of the center line CL, and the third wire 172 may be disposed in the outer side of the center line CL. In one embodiment, the second and third wires 171 and 172 respectively correspond to the data line 171 and the driving voltage line 172. The second wire 171 may include a metal with strain greater than that of the third wire 172.

Figure 18:
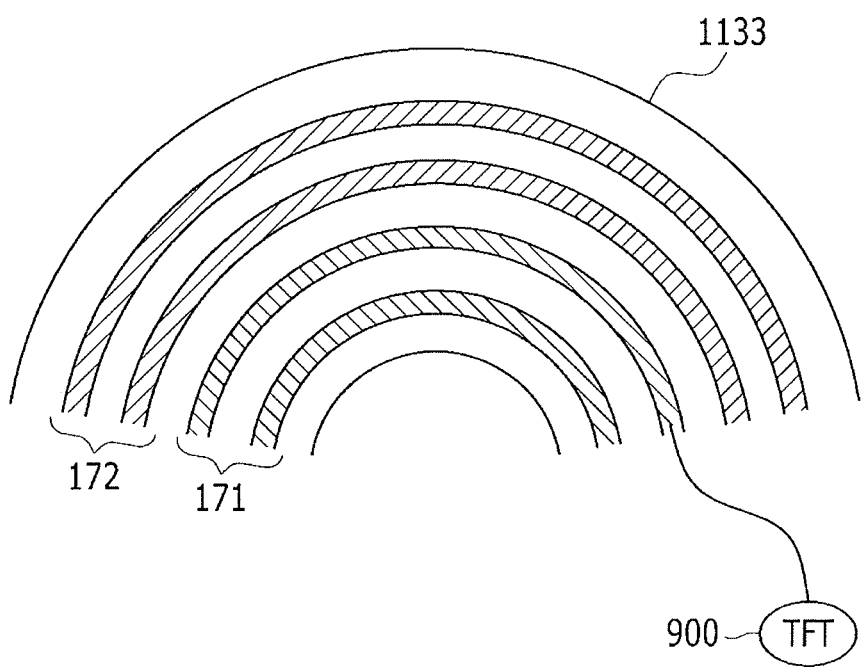
FIG. 18 illustrates an example of a connection structure between a wire and a sensing transistor for measuring strain on the wire.

In one embodiment, a sensing thin film transistor 900 for measuring strain of the first to third wires 121, 171, and 172 on the bridge 1130 may be disposed on the pixel forming plates 1110. For example, referring to FIG. 18, the sensing thin film transistor 900 may be connected to the second wire 171 to measure resistance of the second wire 171, in order to detect strain on second wire 171. The sensing thin film transistor 900 may be, for example, a sensing thin film transistor for measuring resistance of metal.

Figure 19:
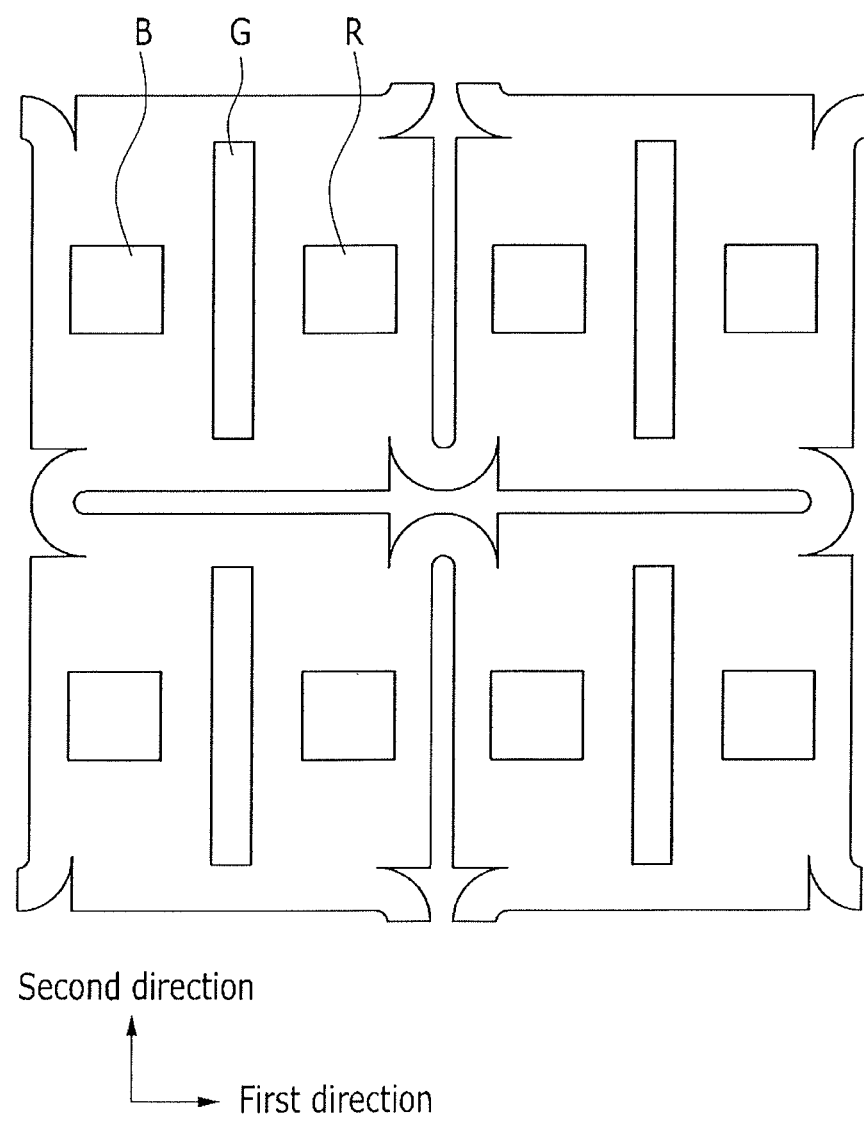
FIGS. 19 to 21 illustrate layout embodiments of subpixels.
Figure 20:
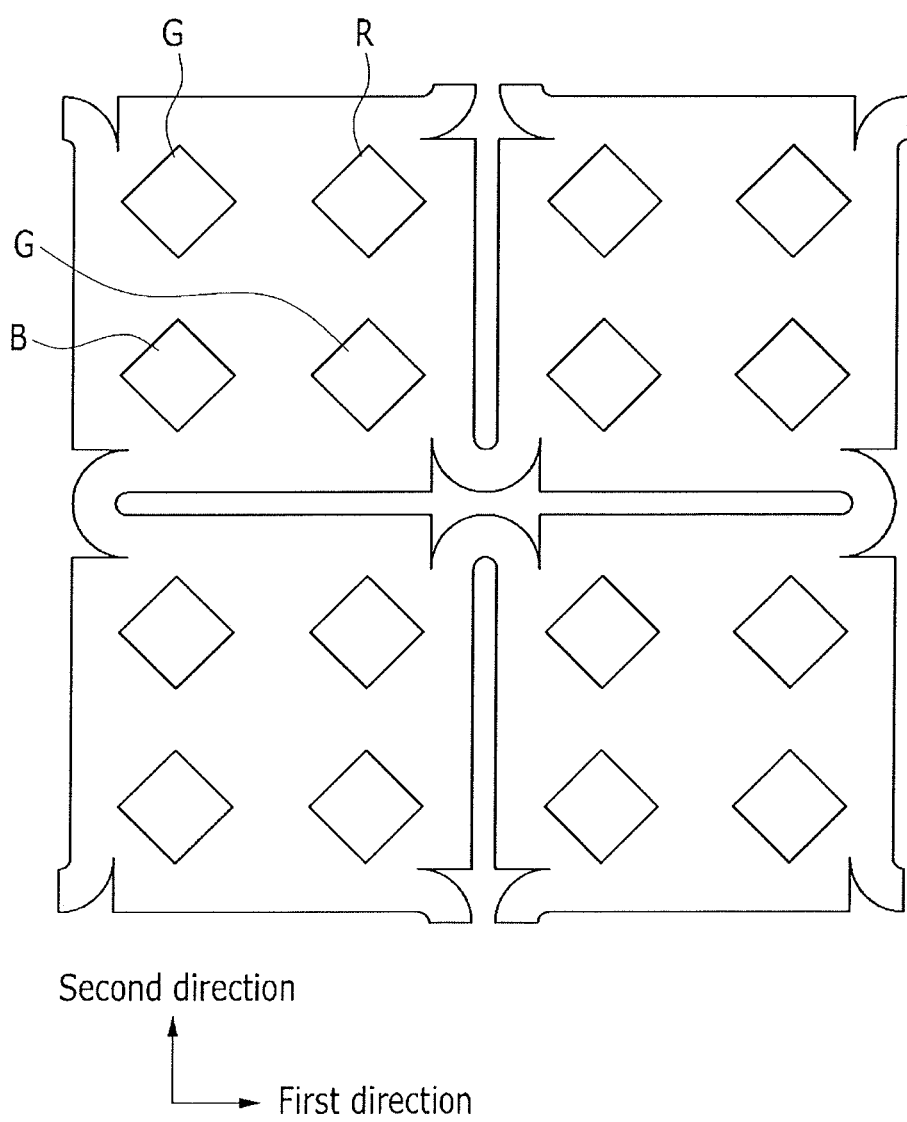
Figure 21:
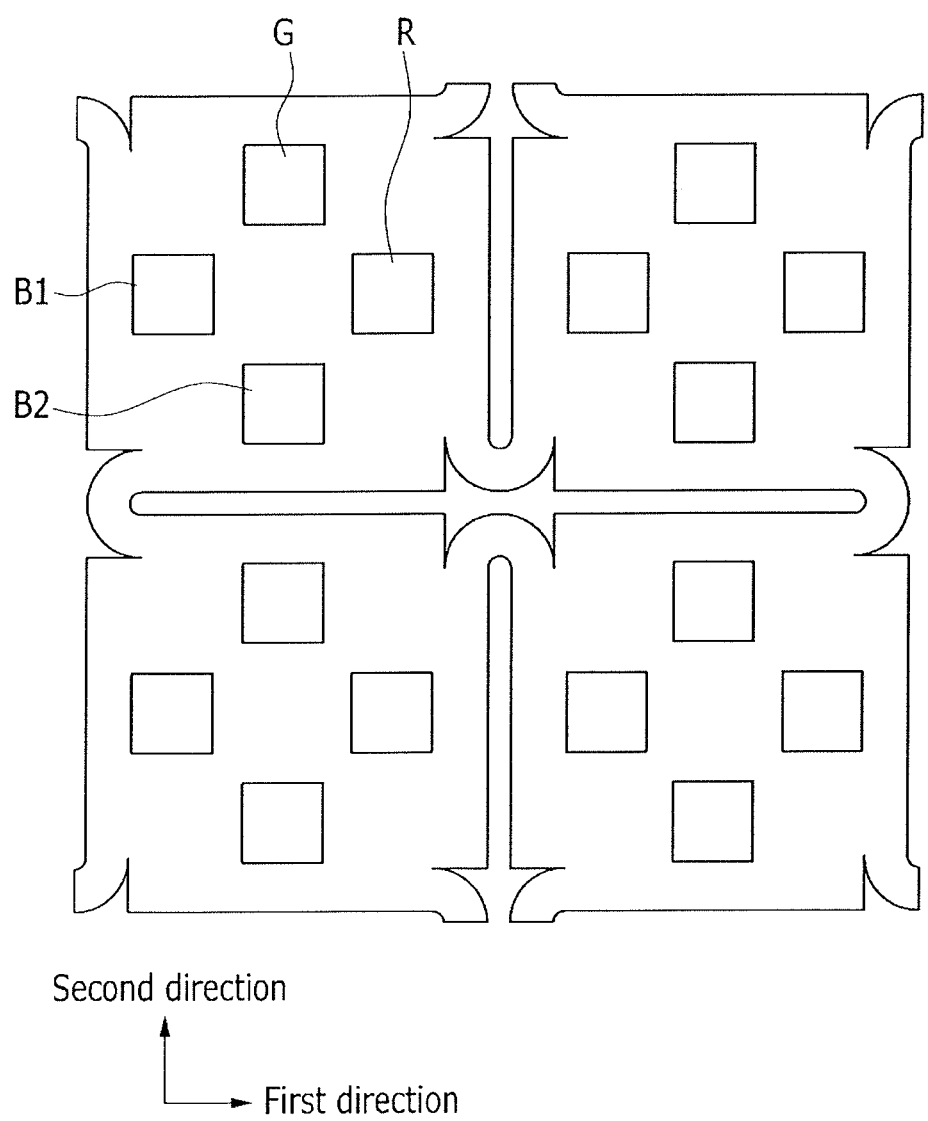

FIGS. 19, 20, and 21 are examples of layout views of subpixels on pixel forming plates. As described above, the pixel PX on each of the pixel forming plates 1110 may include a plurality of subpixels. In this case, a red subpixel (R), a green subpixel (G), and a blue subpixel (B) may be disposed in various forms in each pixel PX. In another embodiment, at least one pixel PX may be formed on each of the pixel forming plates, e.g., a plurality of pixels PX including red, green, and blue subpixels may be formed on each of the pixel forming plates.

Referring to FIG. 19, the green subpixel (G) is at the center of the pixel forming plate 1110 and extends in the second direction. The blue and red subpixels B and R may be disposed at opposite sides of the green subpixel (G).

Referring to FIG. 20, a pair of green subpixels G may be spaced apart from each other at a predetermined angle with the first direction. The blue and red subpixels B and R may be symmetrical to the pair of green subpixels G based on the second direction.

Referring to FIG. 21, the first blue and red subpixels B1 and R may be spaced apart from each other in the first direction. The green and second blue subpixels G and B2 may be spaced apart from each other in the second direction. In one embodiment, the first and second blue subpixels B1 and B2 may emit light having different wavelengths.

Figure 22:
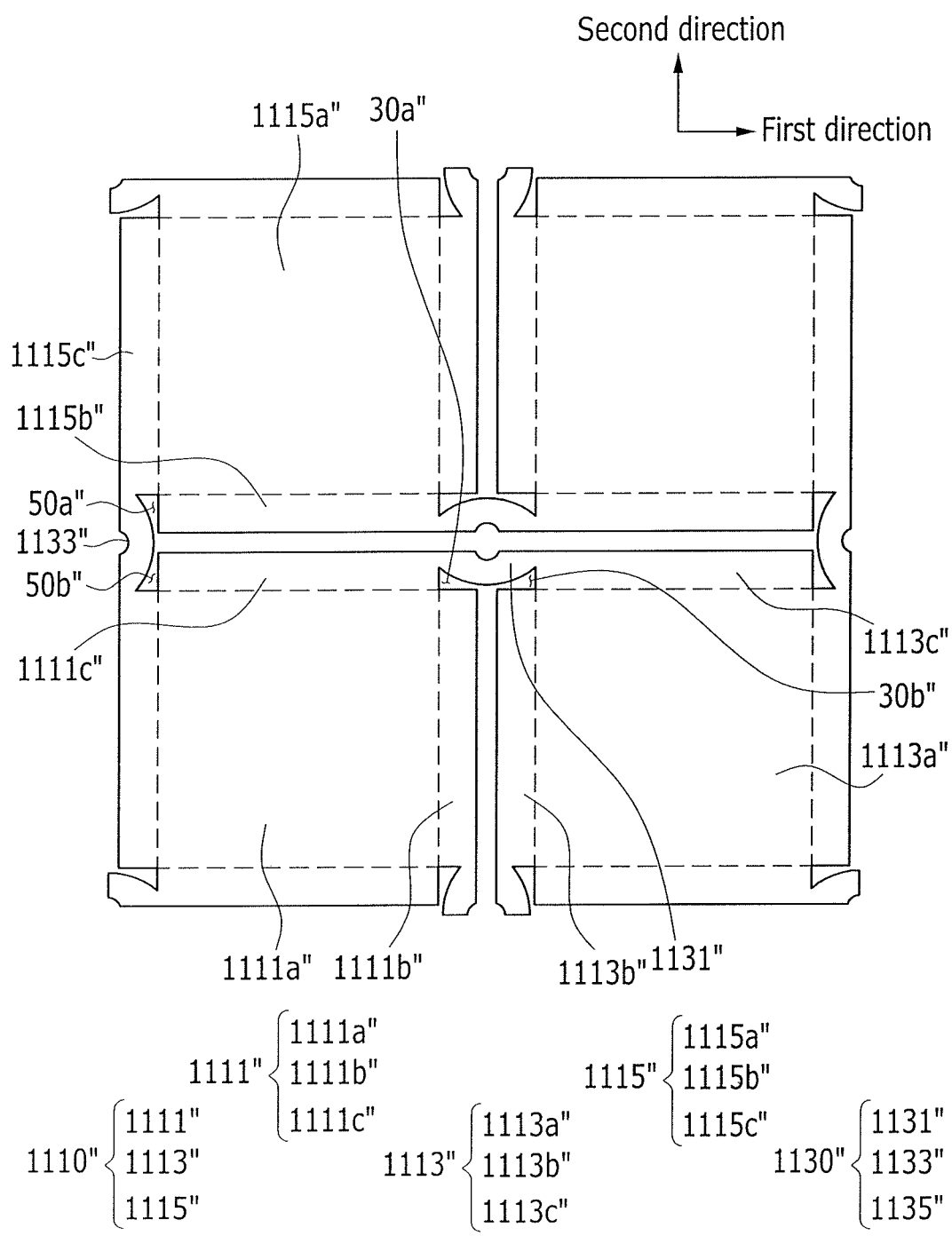
FIG. 22 illustrates a top plan view of a base layer of a second embodiment.

FIG. 22 is a top plan view of a base layer of another embodiment of an OLED display. Referring to FIG. 22, the OLED display is different from the OLED display of the aforementioned embodiment in terms of the structure of the base layer.

As shown in FIG. 4, the first bridge 1131 is upwardly curved along the second direction in the OLED display of the aforementioned embodiment. Further, the first bridge 1131 connecting the first pixel forming plate 1111 and the second pixel forming plate 1113 are connected to the first wing plate 1111*b* and the third wing plate 1113*b*.

However, as shown in FIG. 22, in present embodiment, a first bridge 1131" is downwardly curved along the second direction. Here, the upward and downward curves of the second direction are conceptual positions applied to FIGS. 4 and 22 to differentiate between curved shapes of the first bridge. In this case, the upward curve of the second direction represents a direction from first pixel forming plates 1111 and 1111" toward third pixel forming plates 1115 and 1115". The downward curve of the second direction represents a direction from the third pixel forming plates 1115 and 1115" toward the first pixel forming plates 1111 and 1111".

Configurations of the first to third pixel forming plates 1111", 1113", and 1115" may be the same as those of the first to third pixel forming plates 1111, 1113, and 1115 of the aforementioned embodiment. Also, like the aforementioned embodiment, the first bridge 1131" may have a predetermined width. Further, the first bridge 1131" may be bent to a predetermined curvature radius.

Referring to FIG. 22, the first bridge 1131" is connected to the second wing plate 1111*c*" of the first pixel forming plate 1111" and the fourth wing plate 1113*c*" of the second pixel forming plate 1113". The first bridge 1131*c*" is combined with end portions of the second wing plates 1111*c*" and the fourth wing plate (1113*c*") facing each other. For example, the second wing plate 1111*c*" is on an upper portion of a quadrangular first main supporting plate 1111*a*", and the fourth wing plate 1113*c*" is on an upper portion of a quadrangular second main supporting plate 1113*a*". The first bridge 1131*c*" downwardly curved along the second direction is combined with each of the end portions of the second wing plate 1111*c*" and the fourth wing plate 1113*c*" facing each other.

In this embodiment, a first cut-out groove 30*a*" is formed in the first pixel forming plate 1111" to be adjacent to an area connected with the first bridge 1131". For example, the first cut-out groove 30*a*" may be between the first pixel forming plate 1111" and the first bridge 1131". For example, the first cut-out groove 30*a*" is between one side end portion of the second wing plate 1111*c*" of the first pixel forming plate 1111" and the first bridge 1131". The first cut-out groove 30*a*" may prevent the base layer from being broken due to stress occurring between one side end portion of the first wing plate 1111*b*" and the first bridge 1131".

In FIG. 22, if the first cut-out groove 30*a*" is not formed between the first wing plate 1111*b*" of the first pixel forming plate 1111" and the first bridge 1131", and the same material as the first wing plate 1111*b*" and the first bridge 1131" is filled in a region of the first cut-out groove 30*a*", the first bridge 1131" may be modified so that stress may be concentrated on the region. Accordingly, a crack may occur in the region. Further, a pixel laminated on the first pixel forming plate 1111" may be damaged.

In addition, a second cut-out groove 30*b*" is formed in the second pixel forming plate 1113" to be adjacent to an area connected with the first bridge 1131". For example, the second cut-out groove 30*b*" may be between the second pixel forming plate 1113" and the first bridge 1131". For example, the second cut-out groove 30*b*" is between one side end portion of the third wing plate 1113*b*" of the second pixel forming plate 1113" and the first bridge 1131". Similar to the first cut-out groove 30*a*", the second cut-out groove 30*b*" may prevent the base layer from being broken due to stress occurring between one side end portion of the third wing plate 1113*c*" and the first bridge 1131".

In addition, similar to the first and second cut-out grooves 30*a*" and 30*b*" described above, a fourth cut-out groove 50*b*" may be formed in the first pixel forming plate 1111" to be adjacent to an area connected with the second bridge 1133". Further, a third cut-out groove 50*a*" may be formed in the third pixel forming plate 1115" to be adjacent to an area connected with the second bridge 1133".

Figure 23:
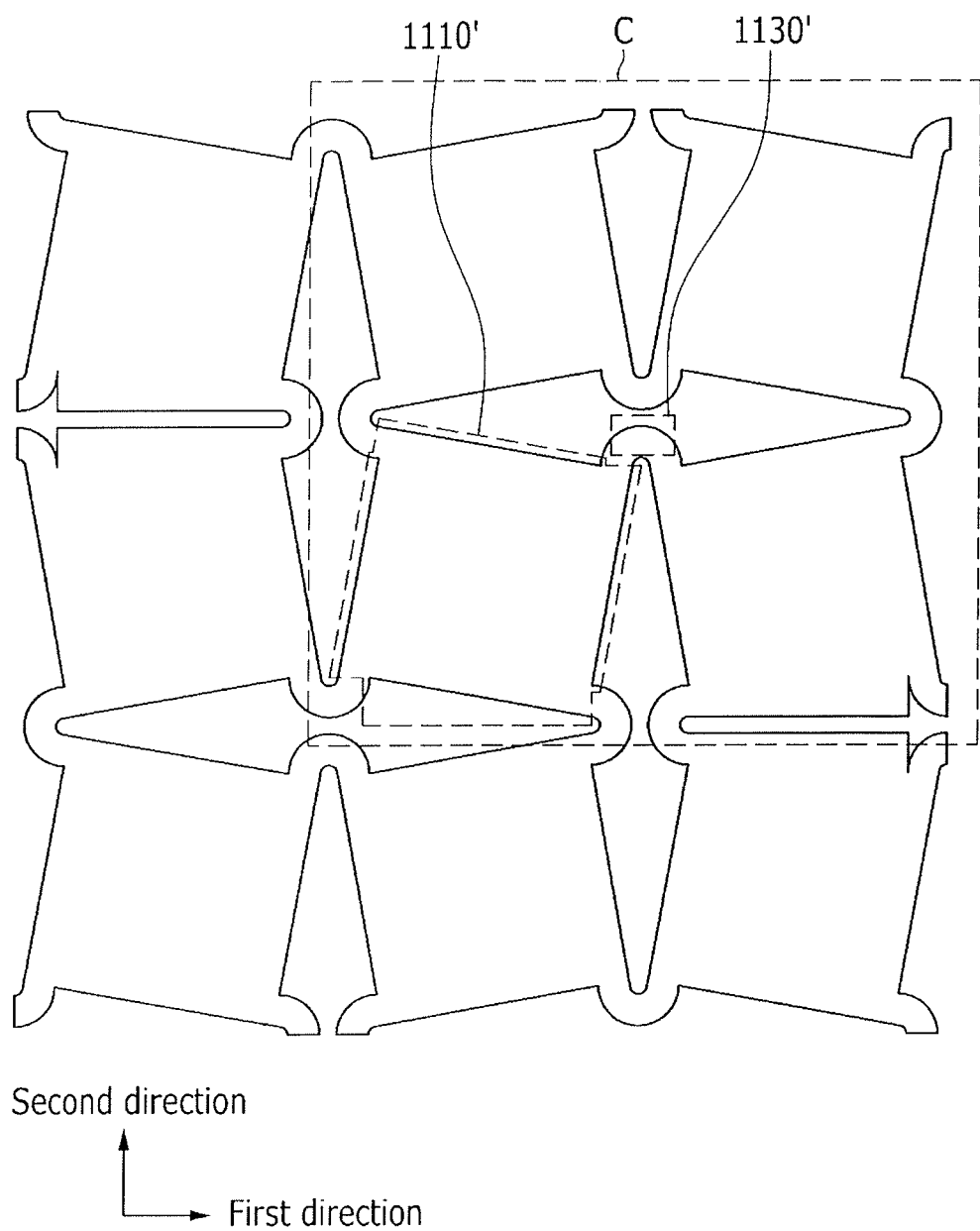
FIG. 23 illustrates a top plan view of a base layer of a third embodiment.
Figure 24:
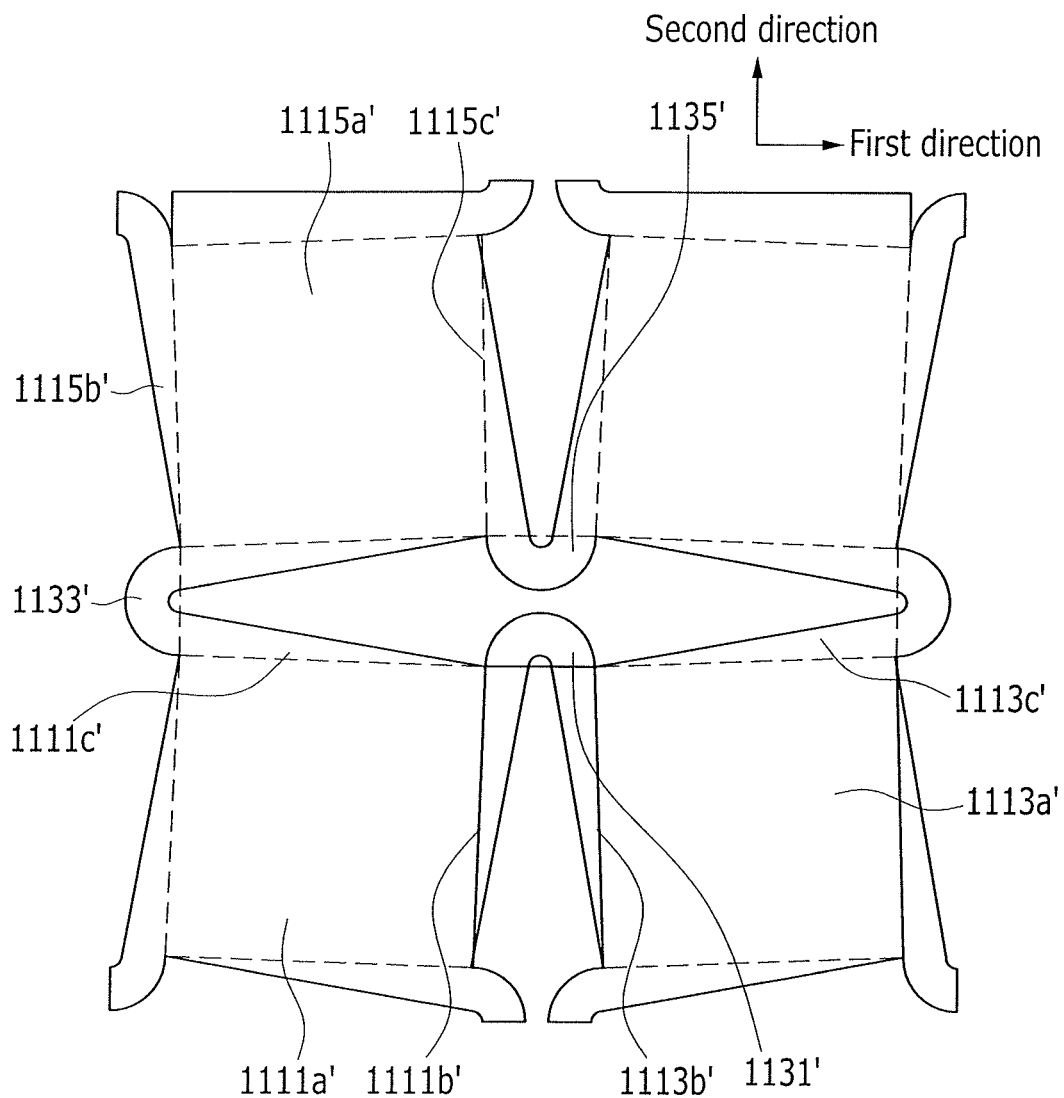
FIG. 24 illustrates an enlarged view of area C in FIG. 23.
Figure 25:
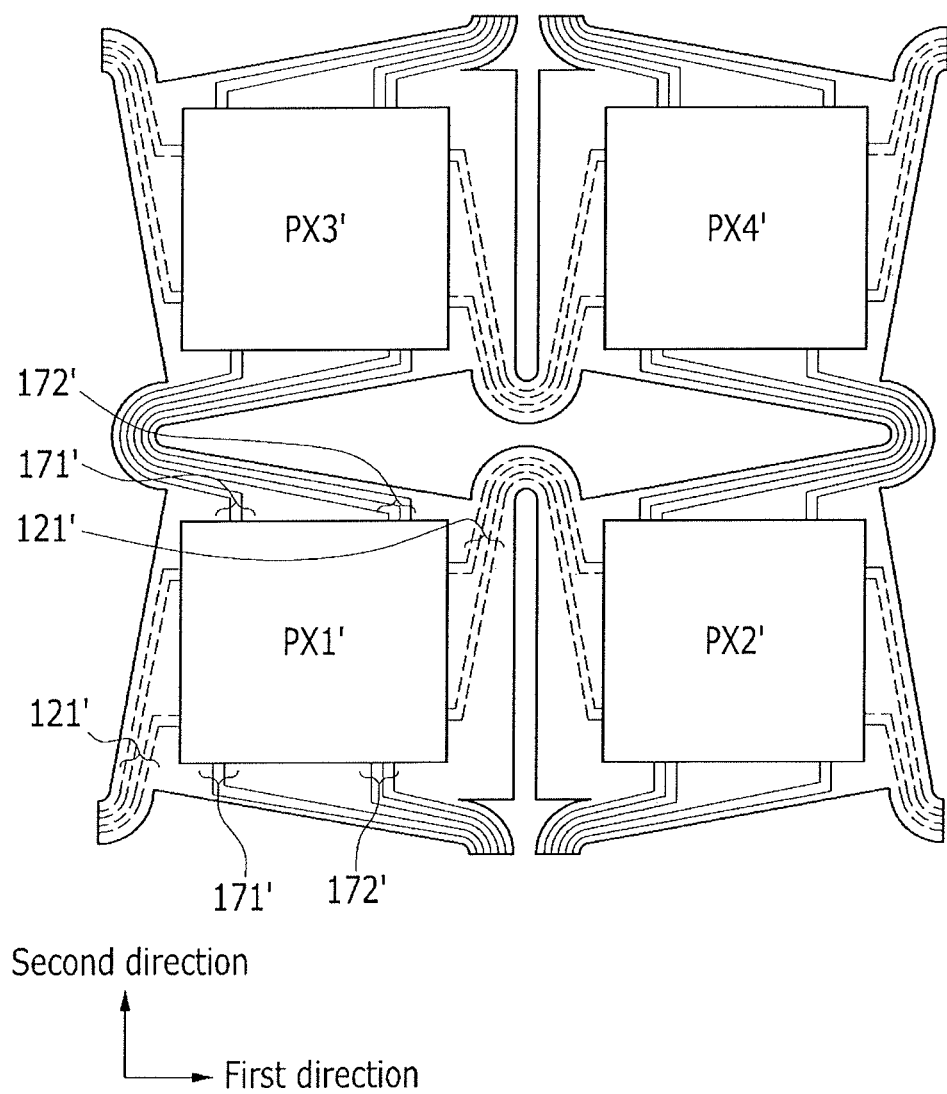
FIG. 25 illustrates an example of first to third wires connected to respective pixels on the base layer in FIG. 24.

FIG. 23 is a top plan view of a base layer of another embodiment of an OLED display. FIG. 24 illustrates an enlarged view of area C in FIG. 23. FIG. 25 illustrates an example of first to third wires connected to respective pixels on the base layer in FIG. 24. In FIGS. 23 to 25, the OLED display is different from the OLED display of the aforementioned initial embodiment in terms of the structure of the base layer.

As shown in FIG. 4, in the OLED display of the aforementioned initial embodiment, the cut-out grooves 30*a*, 30*b*, 50*a*, 50*b* are formed in the pixel forming plates 1111, 1113, and 1115 to be adjacent to an area connected with the bridge 1131 and 1133. However, in the OLED display of the present embodiment, as shown in FIGS. 23 and 24, a cut-out groove is not formed in the pixel forming plates 1111', 1113', 1115' to be adjacent to the area connected to the bridge 1131' and 1133'. That is, the OLED display of this embodiment is different in terms of whether the cut-out groove is formed in the base layer or not.

According to the second embodiment described above, the first and second pixel forming plates 1111' and 1113' are arranged in the first direction. Further, the first and third pixel forming plates 1111' and 1115' are arranged in the second direction. In this case, the first and second pixel forming plates 1111' and 1113' are connected by the first bridge 1131', and the first and third pixel forming plates 1111', 1115' are connected by the second bridge 1133'.

For example, the first pixel forming plate 1111' includes a first main supporting plate 1111a', and first and second wing plates 1111b' and 1111c'.

The first main supporting plate 1111a' may have a substantially quadrangular shape in a center area of the first pixel forming plate 1111'. Further, the first and second wing plates 1111b' and 1111c' are formed in a lateral surface of the first pixel forming plate 1111', and are combined with the bridge connecting the pixel forming plates to each other. The second wing plate 1111c' is disposed in the first main supporting plate 1111a' to be adjacent to the first wing plate 1111b'. In FIG. 24, a dotted line shown between the first main supporting plate 1111a" and the first and second wing plates 1111b" and 1111c" is a virtual line to distinguish between the main supporting plate and the wing plate.

In this case, the first and second wing plates 1111b' and 1111c' disposed in the lateral surface of the first pixel forming plate 1111' may be formed to have a substantially triangular shape. As shown in FIG. 24, since the first and second wing plates 1111b' and 1111c' are formed to have a triangular shape, a cut-out groove is not formed between the first bridge 1131' and the second wing plate (1111c').

Similar to the aforementioned first pixel forming plate 1111', the wing plates of the second and third pixel forming plates 1113' and 1115' are also formed to have a triangular shape, and a cut-out groove is not formed between the second and third pixel forming plates 1113' and 1115' and the bridge.

Referring to FIG. 25, in the present embodiment, first to third wires 121', 171', and 172' connected to pixels PX1', PX2', PX3', and PX4' formed on the pixel forming plates 1110' may be formed on bridges 1131', 1133', and 1135'. For example, in the same way as the first embodiment, a plurality of wires connected to the pixels PX1', PX2', PX3', and PX4' may extend to the pixel forming plates through the bridges 1131', 1133', and 1135', respectively.

For example, first wires 121', extended in the first direction through the pixel PX1' formed on the first pixel forming plate 1111', are formed on the first bridge 1131'. Further, the first wires 121' may be connected to the pixel PX2' of the second pixel forming plate 1113'. For example, the first wires 121' are formed to extend in the first direction through the first pixel forming plate 1111', the first bridge 1131', and the second pixel forming plate 1113'.

Second and third wires 171' and 172', extended in the second direction through the pixel PX1' formed on the first pixel forming plate 1111', are formed on the second bridge 1133'. Further, the second and third wires 171' and 172' may be connected to the pixel PX3' of the third pixel forming plate 1115'. For example, the second and third wires 171' and 172' are formed to extend through the first pixel forming plate 1111', the second bridge 1133', and the third pixel forming plate 1115'.

In the present embodiment, the first to third wires 121', 171', and 172' through the first or second bridge 1131' or 1133' may be disposed in the first or second bridge 1131' or 1133' in the same way as the embodiment in FIGS. 13 to FIG. 17. Since the first to third wires 121', 171', and 172' are disposed in the aforementioned structure, the first to third wires 121', 171', and 172' may be prevented from being cut or cracked due to repetitive moving of the first to third pixel forming plates 1111', 1113', and 1115'.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the invention as set forth in the following claims.

What is claimed is:

1. A display, comprising:
a first pixel forming plate;
a second pixel forming plate separated from the first pixel forming plate;
a bridge connecting the first pixel forming plate and the second pixel forming plate; and
a pixel disposed in the first pixel forming plate and including a red subpixel, a green subpixel, and a blue subpixel.

2. The display of claim 1, wherein
one of the red subpixel, the green subpixel, and the blue subpixel is narrower and longer than the remaining red subpixel, green subpixel, and blue subpixel.

3. The display of claim 1, wherein
the pixel further includes a green subpixel, and
the green subpixel is aligned in a first direction and the red subpixel and the blue subpixel are aligned in a second direction crossing the first direction.

4. The display of claim 1, wherein
one or more of the red subpixel, the green subpixel, and the blue subpixel has a rhombus.

5. The display of claim 1, wherein
one or more of the red subpixel, the green subpixel, and the blue subpixel has a quadrilateral.

6. The display of claim 1, further comprising:
a first buffer layer disposed on the first pixel forming plate;
light emitting elements disposed on the first buffer layer and corresponding to the red subpixel, the green subpixel, and the blue subpixel; and
a first encapsulating layer covering the light emitting elements.

7. The display of claim 6, wherein
the first encapsulation layer is in contact with an upper surface of the first pixel forming plate.

8. The display of claim 6, wherein
the first encapsulation layer is in contact with an upper surface of the first buffer layer.

9. The display of claim 6, further comprising:
a second buffer layer disposed on the second pixel forming plate and separated from the first buffer layer; and
a second encapsulating layer disposed on the second pixel forming plate and separated from the first encapsulation layer.

10. The display of claim 1, wherein the bridge has a curved shape.

* * * * *